United States Patent
Ravkin et al.

(10) Patent No.: US 7,632,376 B1
(45) Date of Patent: Dec. 15, 2009

(54) METHOD AND APPARATUS FOR ATOMIC LAYER DEPOSITION (ALD) IN A PROXIMITY SYSTEM

(75) Inventors: Mike Ravkin, Sunnyvale, CA (US); Mikhail Korolik, San Jose, CA (US); Mark Wilcoxson, Oakland, CA (US)

(73) Assignee: Lam Research Corporation, Fremont, CA (US)

(*) Notice: Subject to any disclaimer, the term of this patent is extended or adjusted under 35 U.S.C. 154(b) by 727 days.

(21) Appl. No.: 11/173,729

(22) Filed: Jun. 30, 2005

Related U.S. Application Data

(63) Continuation-in-part of application No. 10/404,270, filed on Mar. 31, 2003, now Pat. No. 7,069,937, which is a continuation-in-part of application No. 10/330,843, filed on Dec. 24, 2002, now Pat. No. 7,198,055, which is a continuation-in-part of application No. 10/261,839, filed on Sep. 30, 2002, now Pat. No. 7,234,477.

(51) Int. Cl.
*C23F 1/00* (2006.01)
*H01L 21/306* (2006.01)

(52) U.S. Cl. .............. 156/345.1; 156/345.15; 156/345.18; 156/345.21; 156/345.22

(58) Field of Classification Search .............. None
See application file for complete search history.

(56) References Cited

U.S. PATENT DOCUMENTS

| | | |
|---|---|---|
| 3,953,265 A | 4/1976 | Hood |
| 4,086,870 A | 5/1978 | Canavello et al. |
| 4,367,123 A | 1/1983 | Beck |
| 4,444,492 A | 4/1984 | Lee |
| 4,838,289 A | 6/1989 | Kottman et al. |
| 5,102,494 A | 4/1992 | Harvey et al. |
| 5,180,431 A | 1/1993 | Sugimoto et al. |

(Continued)

FOREIGN PATENT DOCUMENTS

EP  0 905 746 A1  3/1999

(Continued)

OTHER PUBLICATIONS

J.A. Britten, "A moving-zone Marangoni drying process for critical cleaning and wet processing," Oct. 1997, *Solid State Technology*.

(Continued)

*Primary Examiner*—Duy-Vu N Deo
(74) *Attorney, Agent, or Firm*—Martine Penilla & Gencarella LLP

(57) ABSTRACT

An apparatus for processing a substrate is provided which includes a first process window configured to apply a first fluid meniscus between the first process window and a surface of the substrate. The apparatus further includes a second process window configured to generate a second fluid meniscus between the second process window and the surface of the substrate. The apparatus further includes a third process window configured to generate a third fluid meniscus between the third process window and the surface of the substrate. The apparatus is configured to apply the first fluid meniscus, the second fluid meniscus, and the third fluid meniscus to the surface of the substrate in order during an atomic layer deposition operation.

23 Claims, 22 Drawing Sheets

U.S. PATENT DOCUMENTS

| | | |
|---|---|---|
| 5,271,774 A | 12/1993 | Leenaars et al. |
| 5,294,257 A | 3/1994 | Kelly et al. |
| 5,343,234 A | 8/1994 | Kuehnle |
| 5,361,449 A | 11/1994 | Akimoto |
| 5,472,502 A | 12/1995 | Batchelder |
| 5,558,111 A | 9/1996 | Lofaro |
| 5,601,655 A | 2/1997 | Bok et al. |
| 5,660,642 A | 8/1997 | Britten |
| 5,705,223 A | 1/1998 | Bunkofske |
| 5,709,757 A | 1/1998 | Hatano et al. |
| 5,807,522 A | 9/1998 | Brown et al. |
| 5,830,334 A | 11/1998 | Kobayashi |
| 5,882,433 A | 3/1999 | Ueno |
| 5,893,004 A | 4/1999 | Yamamura |
| 5,945,351 A | 8/1999 | Mathuni |
| 5,975,098 A | 11/1999 | Yoshitani et al. |
| 5,989,478 A | 11/1999 | Ouellette et al. |
| 5,997,653 A | 12/1999 | Yamasaka |
| 6,042,712 A * | 3/2000 | Mathieu .................. 205/209 |
| 6,086,454 A | 7/2000 | Watanabe et al. |
| 6,092,937 A | 7/2000 | Snodgrass et al. |
| 6,103,636 A | 8/2000 | Zahorik, et al. |
| 6,108,932 A | 8/2000 | Chai |
| 6,132,586 A | 10/2000 | Adams et al. |
| 6,214,513 B1 | 4/2001 | Cai et al. |
| 6,230,722 B1 | 5/2001 | Mitsumori et al. |
| 6,341,998 B1 | 1/2002 | Zhang |
| 6,391,166 B1 | 5/2002 | Wang |
| 6,398,975 B1 | 6/2002 | Mertens et al. |
| 6,417,117 B1 | 7/2002 | Davis |
| 6,433,541 B1 | 8/2002 | Lehman et al. |
| 6,446,358 B1 | 9/2002 | Mitsumori et al. |
| 6,474,786 B2 | 11/2002 | Percin et al. |
| 6,488,040 B1 | 12/2002 | De Larios et al. |
| 6,491,764 B2 | 12/2002 | Mertens et al. |
| 6,495,005 B1 | 12/2002 | Colgan et al. |
| 6,514,570 B1 | 2/2003 | Matsuyama et al. |
| 6,530,823 B1 | 3/2003 | Ahmadi et al. |
| 6,531,206 B2 | 3/2003 | Johnston et al. |
| 6,555,017 B1 | 4/2003 | Rushford et al. |
| 6,616,772 B2 | 9/2003 | De Larios et al. |
| 6,629,540 B2 | 10/2003 | Mitsumori et al. |
| 6,954,993 B1 | 10/2005 | Smith et al. |
| 6,988,326 B2 | 1/2006 | O'Donnell et al. |
| 2002/0007869 A1 | 1/2002 | Pui et al. |
| 2002/0020622 A1 | 2/2002 | Hanson et al. |
| 2002/0051644 A1 | 5/2002 | Sugimoto et al. |
| 2002/0121290 A1 | 9/2002 | Tang et al. |
| 2002/0125212 A1 | 9/2002 | Mertens et al. |
| 2003/0091745 A1 | 5/2003 | Yogev et al. |
| 2003/0091754 A1 | 5/2003 | Chihani et al. |
| 2003/0092264 A1 | 5/2003 | Kajita et al. |
| 2003/0138968 A1 | 7/2003 | Fisher et al. |
| 2004/0060195 A1 | 4/2004 | Garcia et al. |
| 2004/0060573 A1 | 4/2004 | Woods |
| 2004/0060581 A1 | 4/2004 | Garcia et al. |
| 2004/0069319 A1 | 4/2004 | Boyd et al. |
| 2004/0069326 A1 | 4/2004 | Woods et al. |
| 2004/0069329 A1 | 4/2004 | De Larios et al. |
| 2004/0136494 A1 | 7/2004 | Lof et al. |
| 2004/0178060 A1 | 9/2004 | Ravkin et al. |
| 2004/0182422 A1 | 9/2004 | Boyd et al. |
| 2005/0132515 A1 | 6/2005 | Boyd et al. |
| 2005/0139318 A1 * | 6/2005 | Woods et al. .......... 156/345.21 |
| 2005/0145265 A1 | 7/2005 | Ravkin et al. |
| 2005/0145267 A1 | 7/2005 | Korolik et al. |
| 2005/0145268 A1 | 7/2005 | Woods |
| 2005/0148197 A1 | 7/2005 | Woods et al. |
| 2005/0217703 A1 * | 10/2005 | O'Donnell .................. 134/21 |
| 2005/0221621 A1 * | 10/2005 | Mikhaylichenko et al. .. 438/745 |
| 2006/0064895 A1 | 3/2006 | Garcia et al. |

FOREIGN PATENT DOCUMENTS

| | | |
|---|---|---|
| EP | 0 905 747 A1 | 3/1999 |
| EP | 1 489 461 A1 | 12/2004 |
| EP | 1 489 462 A2 | 12/2004 |
| JP | 05837190 | 3/1983 |
| JP | 62150828 A | 7/1987 |
| JP | 02280330 | 11/1990 |
| JP | 02309638 | 12/1990 |
| JP | 08277486 | 10/1996 |
| JP | 11-31672 | 2/1999 |
| JP | 11350169 | 12/1999 |
| JP | 2003-151948 | 5/2003 |
| WO | WO 99/16109 A1 | 4/1999 |
| WO | WO 99/49504 | 9/1999 |
| WO | WO 02/01613 A2 | 1/2002 |
| WO | WO 02/32825 A1 | 4/2002 |
| WO | WO 02/101795 A3 | 12/2002 |
| WO | WO 03/014416 A2 | 2/2003 |
| WO | WO 2004/030051 A2 | 4/2004 |

OTHER PUBLICATIONS

Machine generated English translation of JP08277486 (Reference K).
English Summary of JP05837190 (Reference L).
Machine generated English translation for JP11350169 (Reference L).
U.S. Appl. No. 10/742,303, filed Dec. 18, 2003, Boyd et al.
U.S. Appl. No. 10/817,398, filed Apr. 1, 2004, Korolik et al.
U.S. Appl. No. 10/817,355, filed Apr. 1, 2004, Woods.
U.S. Appl. No. 10/817,620, filed Apr. 1, 2004, Woods.
U.S. Appl. No. 10/817,133, filed Apr. 1, 2004, Woods et al.
U.S. Appl. No. 10/834,548, filed Apr. 28, 2004, Hemker et al.
Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.
Lim et al., "*Atomic Layer deposition of transition metals*", Department of Chemistry and Chemical Biology, Harvard University, Nature Publishing Group, vol. 2, Nov. 2003, pp. 749-754.
ICKnowledge LLC, "*Technology Backgrounder: Atomic Layer Deposition*", ICKnowledge.com, 2004, pp. 1-7.
"*Chemical vapor deposition*", Wikipedia, the free encyclopedia, http://en.wikipedia.org/wiki/Chemical_vapor_deposition, 2005, p. 1-2.
Sigma-Aldrich, "*Atomic Layer Deposition (ALD)*", http://www.sigmaaldrich.com/Area_of_Interest/Chemistry/Materials_Science/Thin_Films, 2005, pp. 1-2.

* cited by examiner

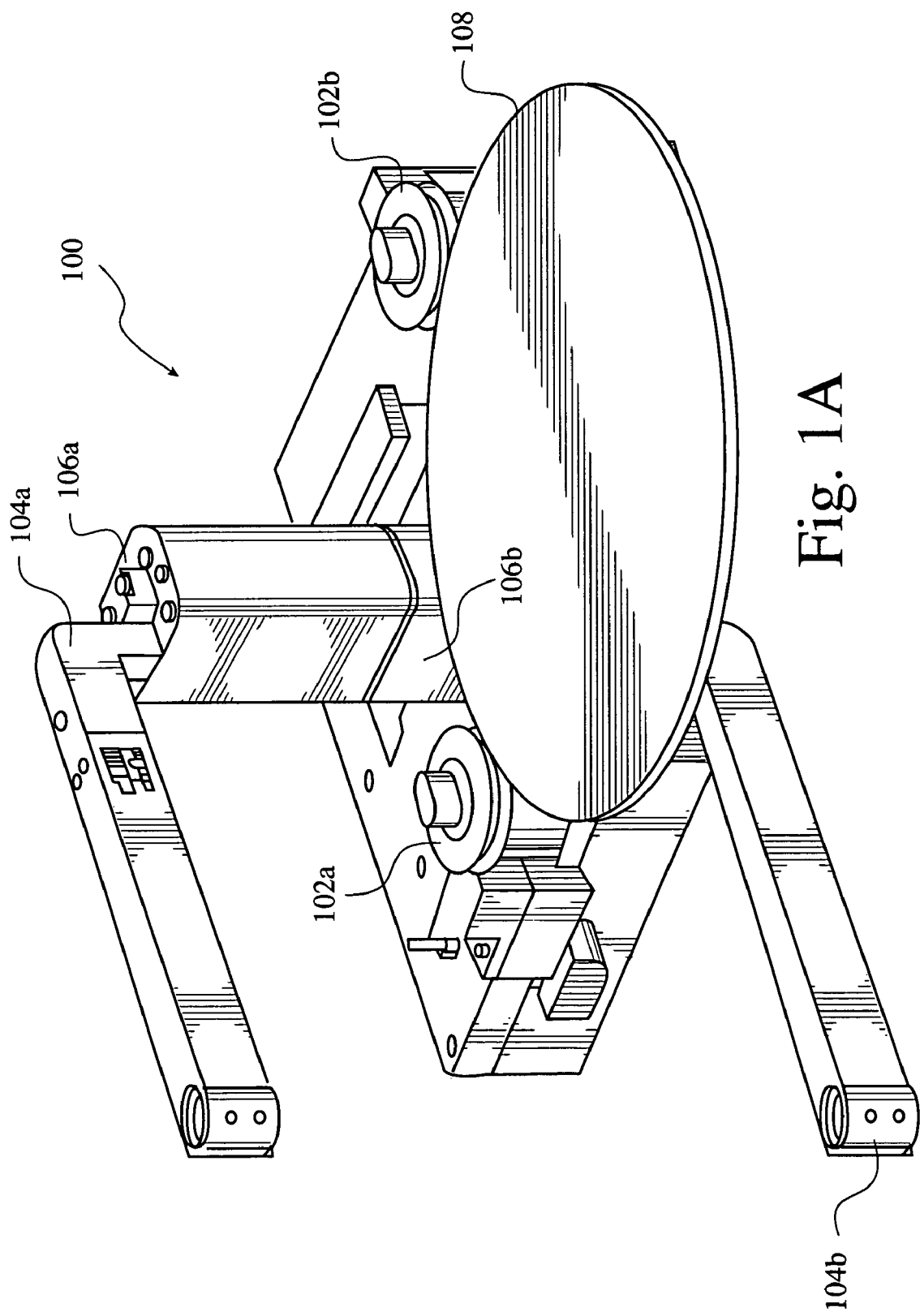

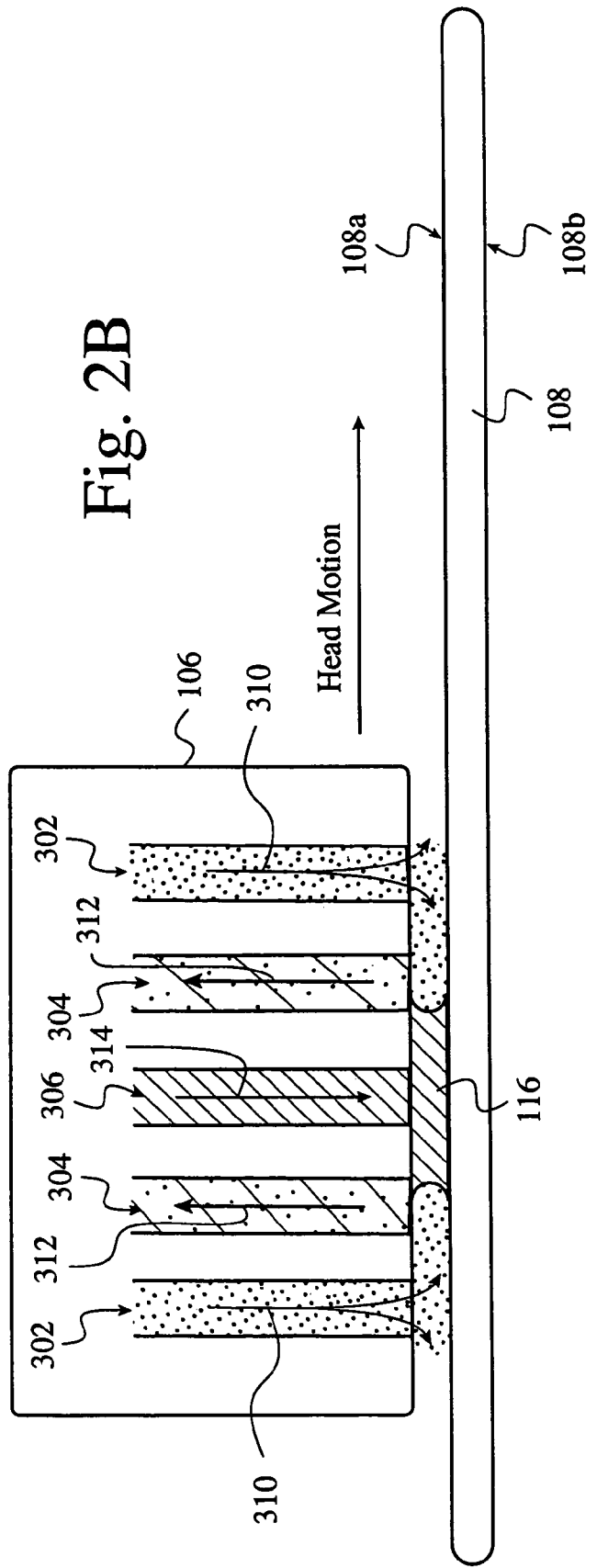

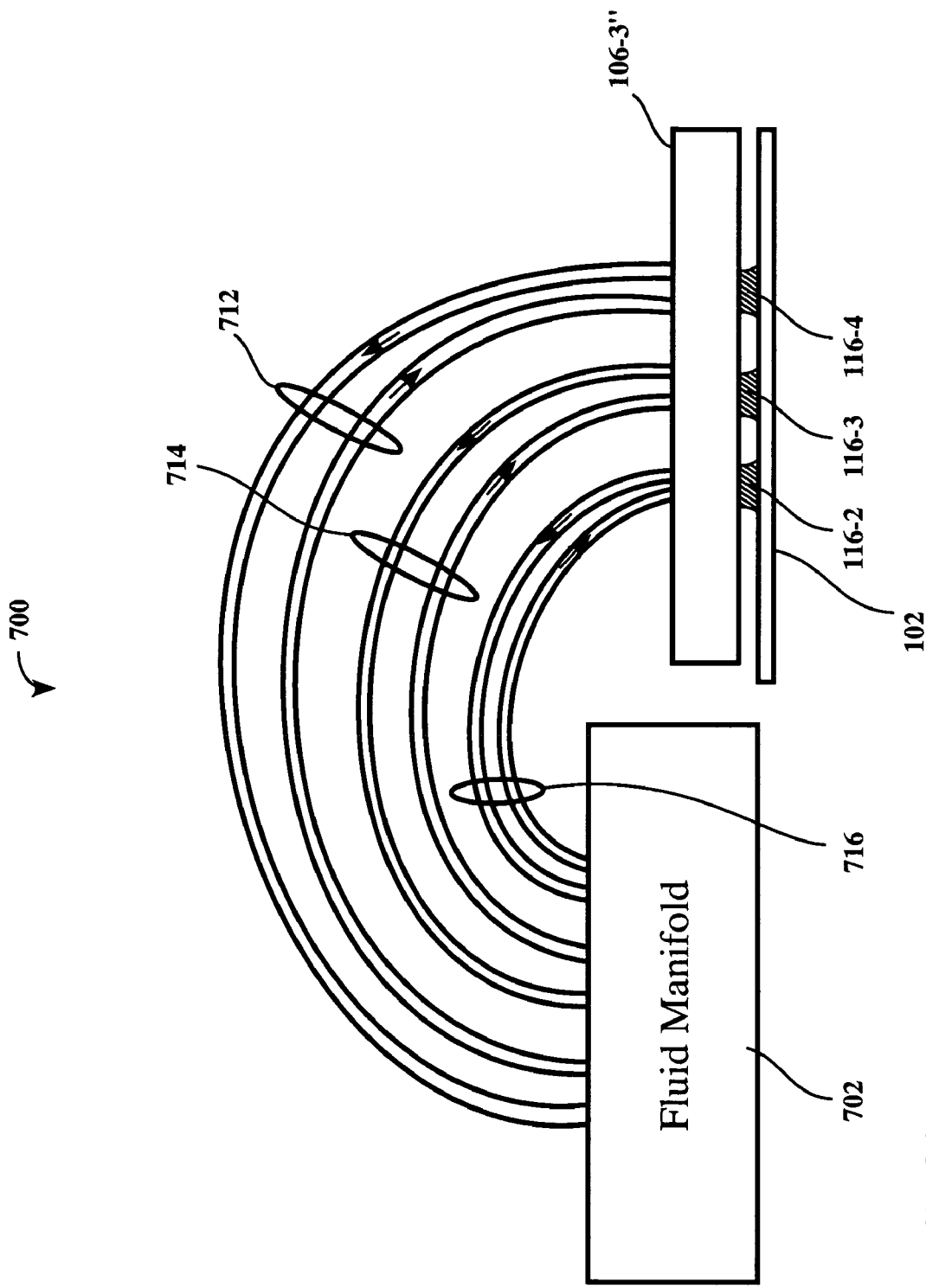

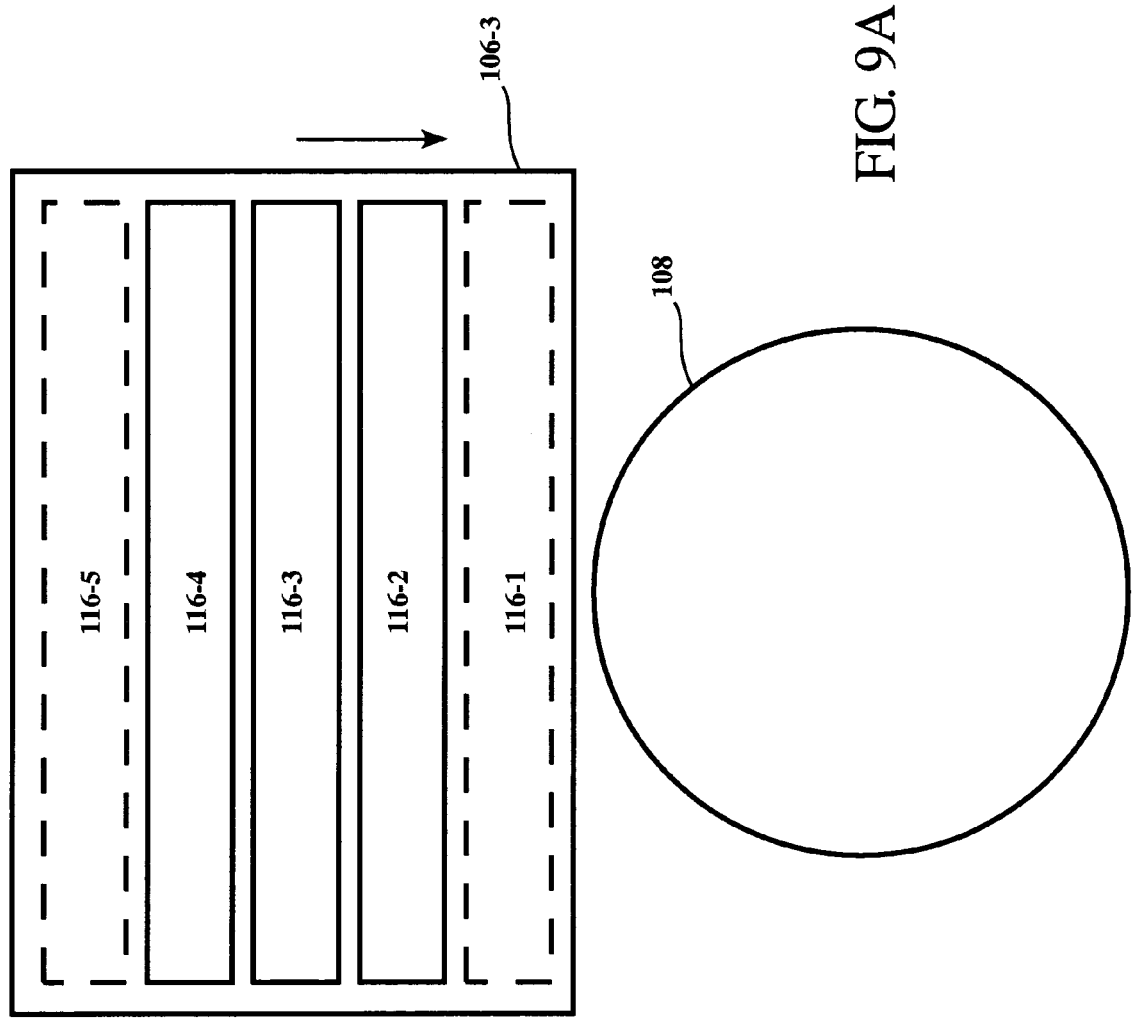

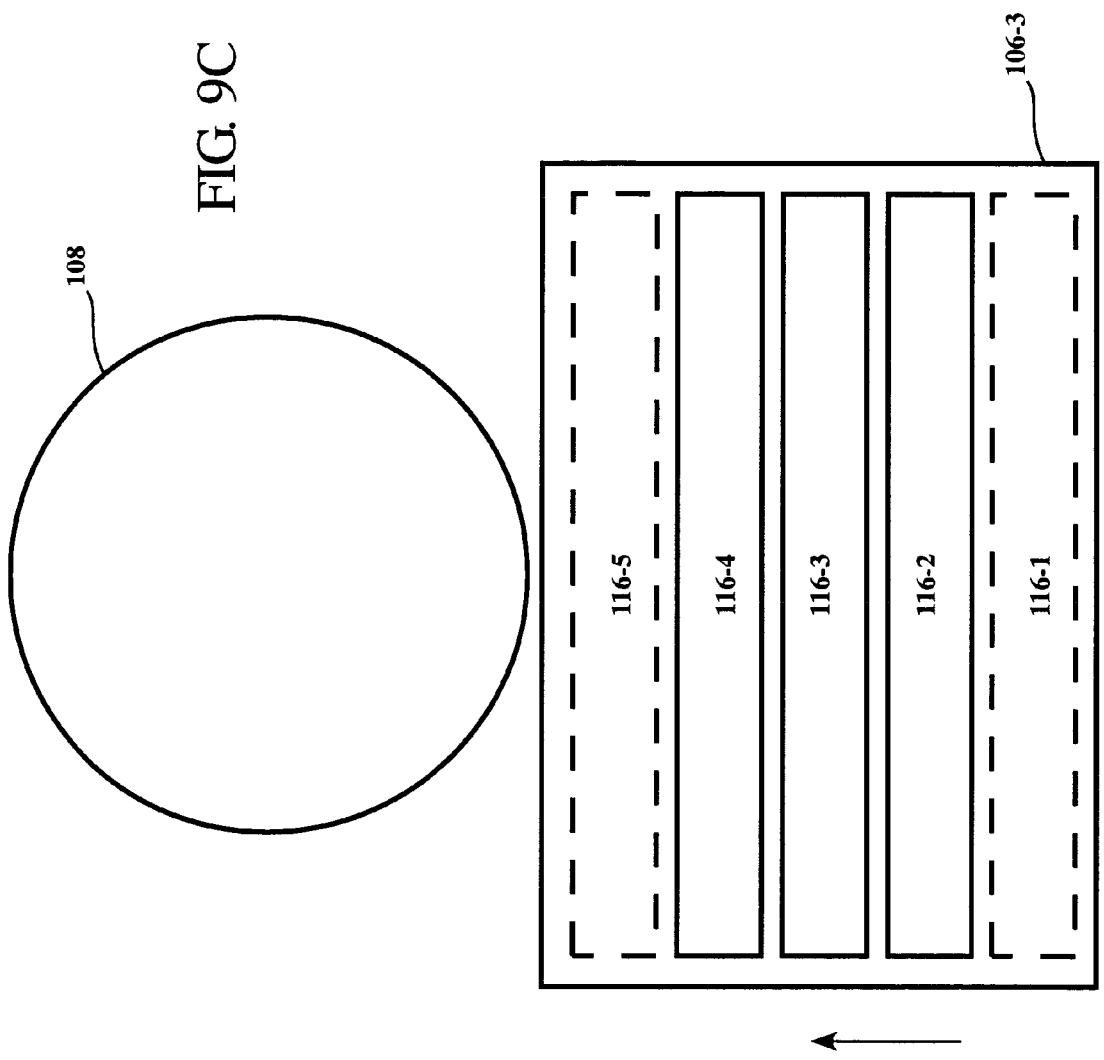

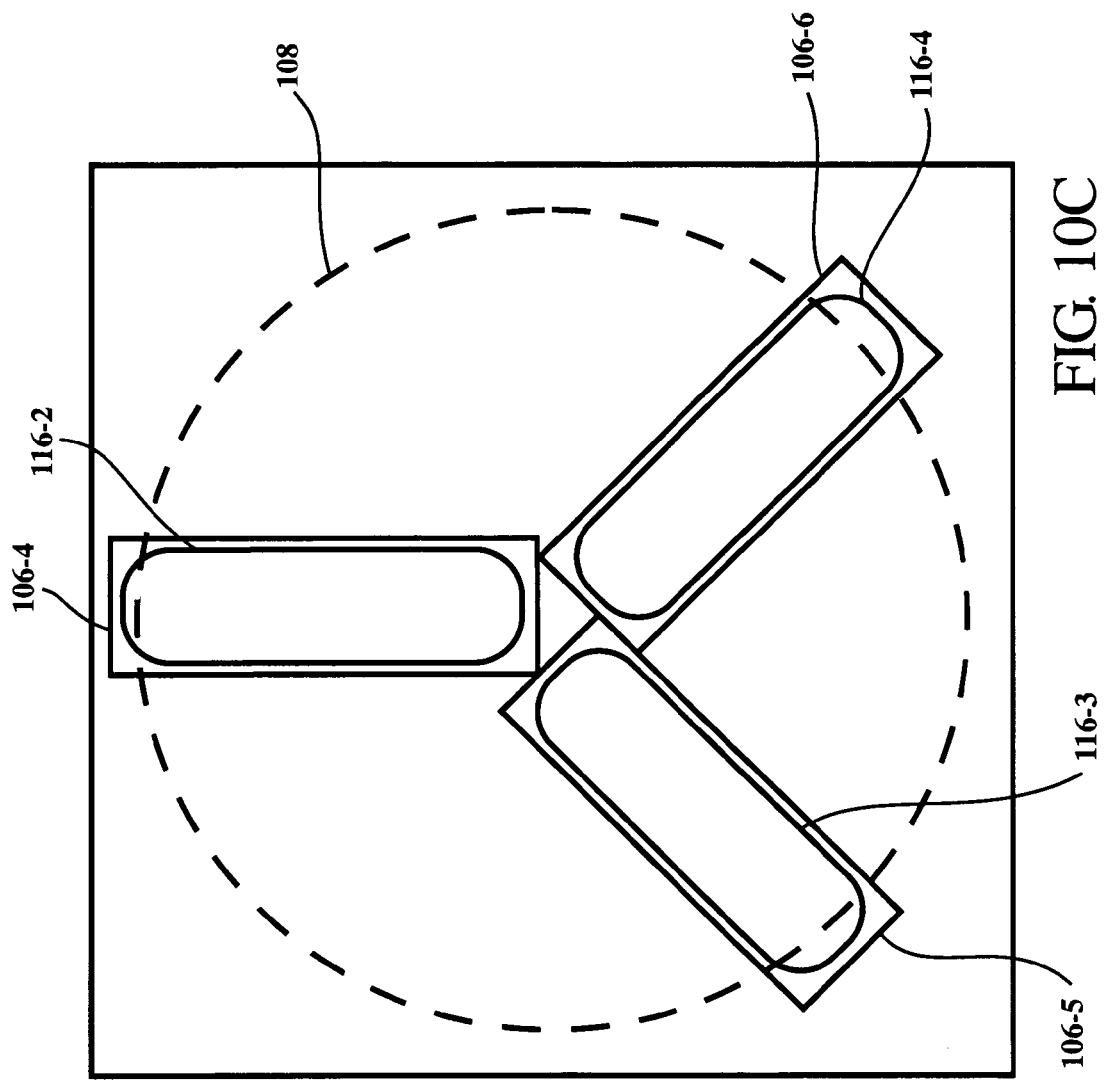

METHOD AND APPARATUS FOR ATOMIC LAYER DEPOSITION (ALD) IN A PROXIMITY SYSTEM

CROSS REFERENCE TO RELATED APPLICATION

This application is a continuation-in-part of U.S. patent application Ser. No. 10/404,270, filed on Mar. 31, 2003 now U.S. Pat. No. 7,069,937, and entitled "Vertical Proximity Processor," from which priority under U.S.C. § 120 is claimed, which is a continuation-in-part and claims priority from U.S. patent application Ser. No. 10/330,843 filed on Dec. 24, 2002 now U.S. Pat. No. 7,198,055 and entitled "Meniscus, Vacuum, IPA Vapor, Drying Manifold," which is a continuation-in-part of U.S. patent application Ser. No. 10/261,839 filed on Sep. 30, 2002 now U.S. Pat. No. 7,234,477 and entitled "Method and Apparatus for Drying Semiconductor Wafer Surfaces Using a Plurality of Inlets and Outlets Held in Close Proximity to the Wafer Surfaces." The aforementioned patent applications are hereby incorporated by reference in their entirety.

BACKGROUND

In a typical atomic layer deposition (ALD) system, whether the process utilized is a batch process or a single wafer process, a chamber utilized for the processing is generally first filled with liquid or gas containing a precursor which promotes deposition of a single atomic layer on a substrate surface. Then this gas or fluid is evacuated from the chamber and a new gas or liquid is supplied to the chamber. A single layer of material deposited at which point the reaction terminates. In order to deposit a second layer the whole operation needs to be repeated. Such systems generally treat the whole substrate or batch of substrates and have low throughput. Therefore, this leads to inefficient substrate production and increased production time and costs.

Therefore, there is a need for a method and an apparatus that avoids the prior art by enabling optimized fluid management and application to a wafer that enables the application of a ALD in a highly controllable and efficient manner.

SUMMARY OF THE INVENTION

Broadly speaking, the present invention fills these needs by providing an apparatus that is capable of processing wafer surfaces using menisci configured for ALD operations while significantly increasing wafer processing efficiencies. It should be appreciated that the present invention can be implemented in numerous ways, including as a process, an apparatus, a system, a device or a method. Several inventive embodiments of the present invention are described below.

In one embodiment, an apparatus for processing a substrate is provided which includes a first process window configured to apply a first fluid meniscus between the first process window and a surface of the substrate. The apparatus further includes a second process window configured to generate a second fluid meniscus between the second process window and the surface of the substrate. The apparatus further includes a third process window configured to generate a third fluid meniscus between the third process window and the surface of the substrate. The apparatus is configured to apply the first fluid meniscus, the second fluid meniscus, and the third fluid meniscus to the surface of the substrate in order during an atomic layer deposition operation.

In another embodiment, a method for processing a substrate is provided which includes applying a first fluid meniscus to a surface of the substrate to apply a chemical precursor to the surface of the substrate and applying a second fluid meniscus to the surface of the substrate to leave an atomic layer of the chemical precursor on the surface of the substrate. The method further includes applying a third fluid meniscus to the surface of the substrate to apply a chemical reactant configured to react with the atomic layer of the chemical precursor to generate a layer of a material.

In yet another embodiment, an apparatus for processing a substrate is provided which includes a first set of conduits defined on a surface of the apparatus configured to apply a first fluid meniscus between the first set of conduits and a surface of the substrate and a second set of conduits defined on the surface of the apparatus configured to generate a second fluid meniscus between the second set of conduits and the surface of the substrate. The apparatus further includes a third set of conduits configured to generate a third fluid meniscus between the third set of conduits and the surface of the substrate. The apparatus is configured to apply the first fluid meniscus, the second fluid meniscus, and the third fluid meniscus to the surface of the substrate in order during an atomic layer deposition operation.

The advantages of the present invention are numerous. Most notably, the apparatuses and methods described herein utilize multiple menisci to efficiently process substrates. In one embodiment, operations which utilize optimal management of fluid application and removal from the substrate may be utilized to perform atomic layer deposition in an extremely efficient manner.

The present invention enables optimal wafer processing through the generation and use of multiple fluid menisci to lay down an atomic layer of a chemical precursor and then applying a chemical reactant to the chemical precursor to generate a single layer of material resulting from the chemical reaction. By utilizing a first fluid meniscus, a second fluid meniscus, and a third fluid meniscus to conduct the atomic layer deposition, layers of material can be deposited in a time efficient manner thereby increasing wafer production.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 1A shows a wafer processing system in accordance with one embodiment of the present invention.

FIG. 2B illustrates a proximity head performing a wafer processing operation in accordance with one embodiment of the present invention.

FIG. 6C illustrates yet another atomic layer deposition system in accordance with one embodiment of the present invention.

FIG. 9A shows an exemplary ALD operation in accordance with one embodiment of the present invention.

FIG. 9C shows a proximity head after one pass has been made over the wafer 102 in accordance with one embodiment of the present invention.

FIG. 10C illustrates a five proximity heads orientation in accordance with one embodiment of the present invention.

DETAILED DESCRIPTION

Figure 1B:
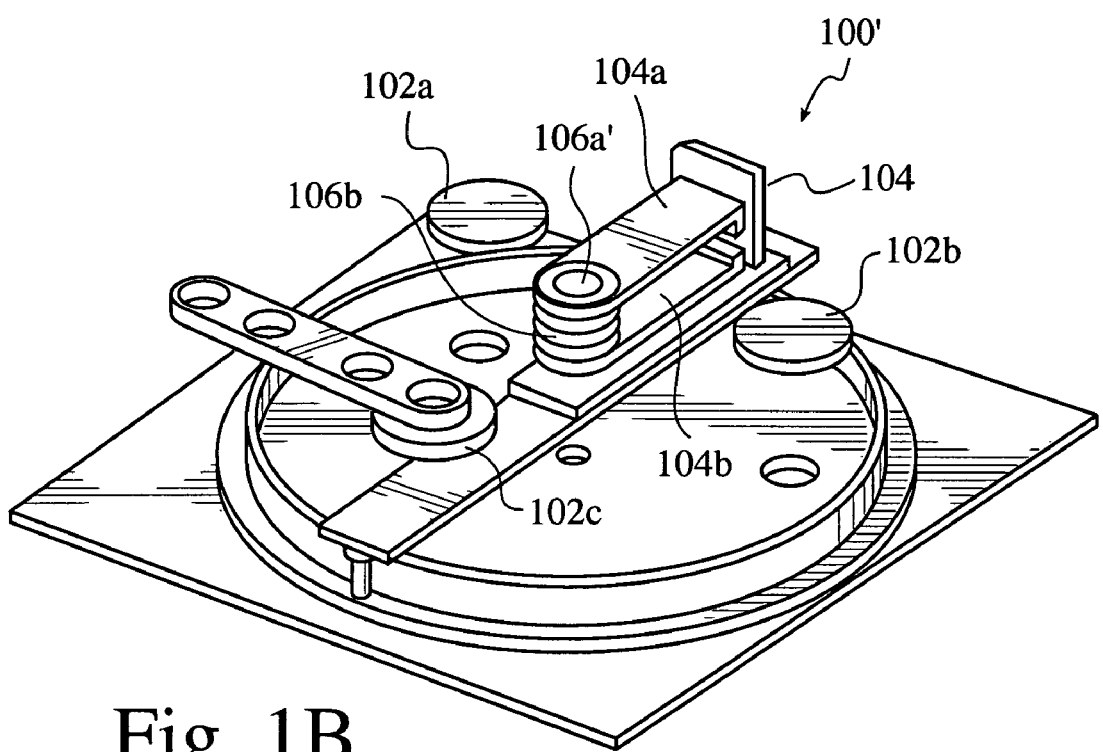
FIG. 1B shows another wafer processing system in accordance with one embodiment of the present invention.

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system using proximity heads to generate multiple shape, size, and location of fluid menisci on the proximity head. In one embodiment, the multiple menisci as discussed herein may be utilized in an atomic layer deposition (ALD) process. This technology may also be utilized to perform any suitable type of combination of types of wafer operation(s) such as, for example drying, etching, plating, etc.

It should be appreciated that the systems and proximity heads as described herein are exemplary in nature, and that any other suitable types of configurations that would enable the generation and movement of fluid menisci described herein may be utilized. In one embodiment, the proximity head(s) may move in a linear fashion from one edge of the wafer to another diametrically opposite edge of the wafer thereby processing the wafer and/or the proximity head(s) may move back over the wafer whereby multiple complete passes of the wafer can accomplish the wafer processing operation. In other exemplary embodiments, suitable non-linear movements may be utilized such as, for example, in a radial motion, in a circular motion, in a spiral motion, in a zig-zag motion, in a random motion, etc.

It should be appreciated that other embodiments may be utilized where the proximity head(s) may rotate multiple menisci along the surface of the wafer. So the multiple menisci can operate on the wafer surface one after another. In addition, the motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In further embodiments, the proximity head may be held stationary and the wafer may be moved to be processed by the fluid meniscus. As with the proximity head, the wafer may move in any suitable motion as long as the desired wafer processing operation is accomplished.

In addition, the proximity head and the wafer processing system as described herein may be utilized to process any shape and size of substrates such as for example, 200 mm wafers, 300 mm wafers, flat panels, etc. Moreover, the size of the proximity head and in turn the sizes of the menisci may vary. In one embodiment, the size of the proximity head and the sizes of the menisci may be larger than a wafer being processed, and in another embodiment, the proximity head and the sizes of the menisci may be smaller than the wafer being processed. Furthermore, the menisci as discussed herein may be utilized with other forms of wafer processing technologies such as, for example, brushing, lithography, megasonics, etc.

A fluid meniscus can be supported and moved (e.g., onto, off of and across a wafer) with a proximity head. Various proximity heads and methods of using the proximity heads are described in co-owned U.S. patent application Ser. No. 10/834,548 filed on Apr. 28, 2004 and entitled "Apparatus and Method for Providing a Confined Liquid for Immersion Lithography," which is a continuation in part of U.S. patent application Ser. No. 10/606,022, filed on Jun. 24, 2003 and entitled "System And Method For Integrating In-Situ Metrology Within A Wafer Process" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," U.S. Pat. No. 6,488,040, issued on Dec. 3, 2002, entitled "Capillary Proximity Heads For Single Wafer Cleaning And Drying," U.S. Pat. No. 6,616,772, issued on Sep. 9, 2003, entitled "Methods For Wafer Proximity Cleaning And Drying," and U.S. patent application Ser. No. 10/742,303 entitled "Proximity Brush Unit Apparatus and Method." Additional embodiments and uses of the proximity head are further described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer." Further embodiments and uses of the proximity head are further described in U.S. patent application Ser. No. 10/957,260 entitled "Apparatus And Method For Processing A Substrate," U.S. patent application Ser. No. 10/956,799 entitled "Apparatus And Method For Utilizing A Meniscus In Substrate Processing" and U.S. patent application Ser. No. 10/957,384 entitled "Phobic Barrier Meniscus Separation And Containment." The aforementioned patent applications are hereby incorporated by reference in their entirety.

It should be appreciated that the system described herein is just exemplary in nature, and the proximity heads described herein may be used in any suitable system such as, for example, those described in the United States Patent Applications referenced above. It should also be appreciated that FIGS. 2 through 4C describe exemplary proximity head configurations and describe formation of a meniscus. Therefore, process variables (e.g. flow rates, dimensions, etc.) described therein may be different than the process variables described for the multiple menisci proximity heads as described in FIGS. 5A through 10C. FIGS. 6A through 10C describe examples of proximity heads that can generate multiple menisci for use in atomic layer deposition.

FIG. 1A shows a wafer processing system 100 in accordance with one embodiment of the present invention. The system 100 includes rollers 102a and 102b which may hold and/or rotate a wafer to enable wafer surfaces to be processed. The system 100 also includes proximity heads 106a and 106b that, in one embodiment, are attached to an upper arm 104a and to a lower arm 104b respectively. In one embodiment, the proximity heads 106a and/or 106b may be multiple menisci proximity heads as described in further detail below. As described herein the term "multiple menisci proximity head" is a proximity head capable of generating one or more fluid menisci where each one or a combination of the menisci may perform a wafer operation. In one embodiment, multiple menisci may be generated by the proximity head 106a and/or 106b to conduct atomic layer deposition (ALD) on the wafer surface. The proximity head may be any suitable apparatus that may generate a fluid meniscus as described herein and described in the patent application incorporated by reference above. The upper arm 104a and the lower arm 104b can be part of an assembly which enables substantially linear movement (or in another embodiment a slight arc-like movement) of the proximity heads 106a and 106b along a radius of the wafer. In yet another embodiment, the assembly may move the proximity heads 106a and 106b in any suitable user defined movement.

In one embodiment the arms 104 are configured to hold the proximity head 106a above the wafer and the proximity head 106b below the wafer in close proximity to the wafer. For example, in one exemplary embodiment this may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. In another embodiment, the upper arm 104a and the lower arm 104b may be configured to start the proximity heads 106a and 106b in a position where the menisci are generated before processing and the menisci that has already been generated between the proximity heads 106a and 106 may be moved onto the wafer surface to be processed from an edge area of a wafer 108. Therefore, the upper arm 104a and the lower arm 104b may be configured in any suitable way so the proximity heads 106a and 106b can be moved to enable wafer processing as described herein. It should also be appreciated that the system 100 may be configured in any suitable manner as long as the proximity head(s) may be moved in close proximity to the wafer to generate and control multiple meniscus that, in one embodiment, are configured to conduct ALD processing. It should also be understood that close proximity may be any suitable distance from the wafer as long as a menisci may be maintained. In one embodiment, the proximity heads 106a and 106b (as well as any other proximity head described herein) may each be located between about 0.1 mm to about 10 mm from the wafer to generate the fluid menisci on the wafer surface. In a preferable embodiment, the proximity heads 106a and 106b (as well as any other proximity head described herein) may each be located bout 0.5 mm to about 2.0 mm from the wafer to generate the fluid menisci on the wafer surface, and in more preferable embodiment, the proximity heads 106a and 106b (as well as any other proximity head described herein) may be located about 1.5 mm from the wafer to generate the fluid menisci on the wafer surface.

In one embodiment, the system 100, the arms 104 are configured to enable the proximity heads 106a and 106b to be moved from processed to unprocessed portions of the wafer. It should be appreciated that the arms 104 may be movable in any suitable manner that would enable movement of the proximity heads 106a and 106b to process the wafer as desired. In one embodiment, the arms 104 may be motivated by a motor to move the proximity head 106a and 106b along the surface of the wafer. It should be understood that although the wafer processing system 100 is shown with the proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate the fluid menisci between the proximity head and the wafer. The fluid menisci may be moved across the wafer to process the wafer by applying fluid to the wafer surface and removing fluids from the surface. In such a way, depending on the fluids applied to the wafer, atomic layer deposition, cleaning, drying, etching, and/or plating may be accomplished. In addition, the proximity heads 106a and 106b may be configured to generate any suitable numbers and/or configurations of menisci. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing the top and/or bottom surfaces of the wafer, the system 100 may also be configured to process one side of the wafer with one type of process (e.g., atomic layer deposition, etching, cleaning, drying, plating, etc.) and process the other side of the wafer using the same process or a different type of process by inputting and outputting different types of fluids or by using a different configuration menisci. The proximity heads can also be configured to process the bevel edge of the wafer in addition to processing the top and/or bottom of the wafer. This can be accomplished by moving the menisci off (or onto) the edge the wafer which processes the bevel edge. It should also be understood that the proximity heads 106a and 106b may be the same type of apparatus or different types of proximity heads.

In an exemplary processing embodiment, the at least one of first inlet may be configured to input processing fluid (also known as a processing fluid inlet), the at least one of a second inlet may be configured to input $N_2$ carrier gas containing isopropyl alcohol (IPA) in vapor form (also known as IPA inlet), and the at least one outlet may be configured to remove fluids from a region between the wafer and a particular proximity head by applying vacuum (also known as vacuum outlet). It should be appreciated that although IPA vapor is used in some of the exemplary embodiments, any other type of vapor may be utilized such as for example, nitrogen, any suitable alcohol vapor, organic compounds, volatile chemicals, etc. that may be miscible with water. In addition, in other embodiments, any suitable type of non-miscible vapors may be utilized such as, for example, oil, hexane, oil-vapor, etc.

In an exemplary cleaning embodiment, a cleaning solution may be used as the processing fluid. In another embodiment, deionized water (DIW) may be used as the processing fluid in a drying operation. An exemplary etching embodiment may be conducted where an etchant may be substituted for the DIW. In an additional embodiment, plating may be accomplished as described in further detail in reference to U.S. patent application Ser. No. 10/607,611 filed on Jun. 27, 2003 entitled "Apparatus and Method for Depositing and Planarizing Thin Films of Semiconductor Wafers" which was incorporated by reference above. As discussed below in reference to multiple fluid menisci proximity heads (or alternatively multiple proximity heads that can generate different types of fluid meniscus), ALD fluids may be used as the processing fluid for ALD operations. In addition, other types of solutions may be inputted into the first inlet and the second inlet depending on the processing operation desired.

It should be appreciated that the inlets and outlets located on a face of the proximity head may be in any suitable configuration as long as stable menisci as described herein may be utilized. In one embodiment, the at least one $N_2$/IPA vapor inlet may be adjacent to the at least one vacuum outlet which is in turn adjacent to the at least one processing fluid inlet to form an IPA-vacuum-processing fluid orientation. It should be appreciated that other types of orientation combinations such as IPA-processing fluid-vacuum, processing fluid-vacuum-IPA, vacuum-IPA-processing fluid, etc. may be utilized depending on the wafer processes desired and what type of wafer processing mechanism is sought to be enhanced. In one embodiment, the IPA-vacuum-processing fluid orientation may be utilized to intelligently and powerfully generate, control, and move the menisci located between a proximity head and a wafer to process wafers. The processing fluid inlets, the $N_2$/IPA vapor inlets, and the vacuum outlets may be arranged in any suitable manner if the above orientation is maintained. For example, in addition to the $N_2$/IPA vapor inlet, the vacuum outlet, and the processing fluid inlet, in an additional embodiment, there may be additional sets of IPA vapor outlets, processing fluid inlets and/or vacuum outlets depending on the configuration of the proximity head desired. It should be appreciated that the exact configuration of the inlet and outlet orientation may be varied depending on the application. For example, the distance between the IPA input, vacuum, and processing fluid inlet locations may be varied so the distances are consistent or so the distances are inconsistent. In addition, the distances between the IPA input, vacuum, and processing fluid outlet may differ in magnitude depending on the size, shape, and configuration of the proximity head 106a and the desired size of a process menisci (i.e., menisci shape and size). In addition, exemplary IPA-vacuum-processing fluid orientation may be found as described in the United States Patent Applications referenced above.

In other embodiments, depending on how close the proximity head is to the surface being processed, IPA may not be utilized and only processing fluid inlets and vacuum outlets can be used to generate the fluid meniscus. Such an embodiment is described in further detail in reference to U.S. application Ser. No. 10/882,835 entitled "Method And Apparatus For Processing Wafer Surfaces Using Thin, High Velocity Fluid Layer" which is hereby incorporated by reference in its entirety.

In one embodiment, the proximity heads 106a and 106b may be positioned in close proximity to a top surface and a bottom surface respectively of the wafer 108 and may utilize the IPA and processing fluid inlets and vacuum outlets as described herein to generate wafer processing menisci in contact with the wafer 108 which are capable of processing the top surface and the bottom surface of the wafer 108. The wafer processing menisci may be generated in a manner consistent with the descriptions in reference to Applications referenced and incorporated by reference above. At substantially the same time the IPA and the processing fluid is inputted, a vacuum may be applied in close proximity to the wafer surface to remove the IPA vapor, the processing fluid, and/or the fluids that may be on the wafer surface. It should be appreciated that although IPA is utilized in the exemplary embodiment, any other suitable type of vapor may be utilized such as for example, nitrogen, any suitable alcohol vapor, organic compounds, hexanol, ethyl glycol, acetone, etc. that may be miscible with water. These fluids may also be known as surface tension reducing fluids. The portion of the processing fluid that is in the region between the proximity head and the wafer is the menisci. It should be appreciated that as used herein, the term "output" can refer to the removal of fluid from a region between the wafer 108 and a particular proximity head, and the term "input" can be the introduction of fluid to the region between the wafer 108 and the particular proximity head.

FIG. 1B shows another wafer processing system 100' in accordance with one embodiment of the present invention. It should be appreciated that any suitable manner of holding or moving the wafer can be used such as, for example, rollers, pins, platen, etc. The system 100' may include rollers 102a, 102b, and 102c which can hold and rotate a wafer to enable wafer surfaces to be processed. In another embodiment, the system may move the wafer without rotation. In yet another embodiment, the wafer may be held instead of being moved and the proximity heads 106a and/or 106b may be moved to process the wafer. The system 100' may also include proximity heads 106a and 106b that, in one embodiment, can be attached to an upper arm 104a and to a lower arm 104b respectively. The upper arm 104a and the lower arm 104b can be a part of a proximity head carrier assembly 104 which enables substantially linear movement of the proximity heads 106a and 106b along a radius of the wafer. In one embodiment the proximity head carrier assembly 104 may be configured to hold the proximity head 106a above the wafer and the proximity head 106b below the wafer in close proximity to the wafer. This may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. In another embodiment, the fluid meniscus may be formed between the two proximity heads 104a and 104b and moved onto the top and bottom surface of the wafer. The upper arm 104a and the lower arm 104b may be configured in any suitable way so the proximity heads 106a and 106b can be moved to enable wafer processing as described herein. It should also be appreciated that the system 100' may be configured in any suitable manner as long as the proximity head(s) may be moved in close proximity to the wafer to generate and control a meniscus on the wafer surface. In another exemplary embodiment, the proximity head 106 may be located at a first end of an arm which rotates around an axis defined by a second end of the arm. Therefore, in such an embodiment, the proximity head may be moved in an arc over the surface of the wafer. In yet another embodiment, the arm may be moved in a combination of a rotational movement and a linear movement. Although shown with a proximity head 106 for each side of the wafer, a single head can be used for a single side of a wafer. Other surface preparation processes can be performed on sides where no proximity head 106 is used, such as a wafer scrub brush.

In another embodiment, the system 100' may include a proximity head docking station that has a transition surface adjacent to the wafer. In such an embodiment, the fluid meniscus may transition between a docking station and the surface of the wafer while in a controlled and managed state. Again, if only one side of the wafer is desired to be processed, one arm with one proximity head may be utilized.

Figure 2A:
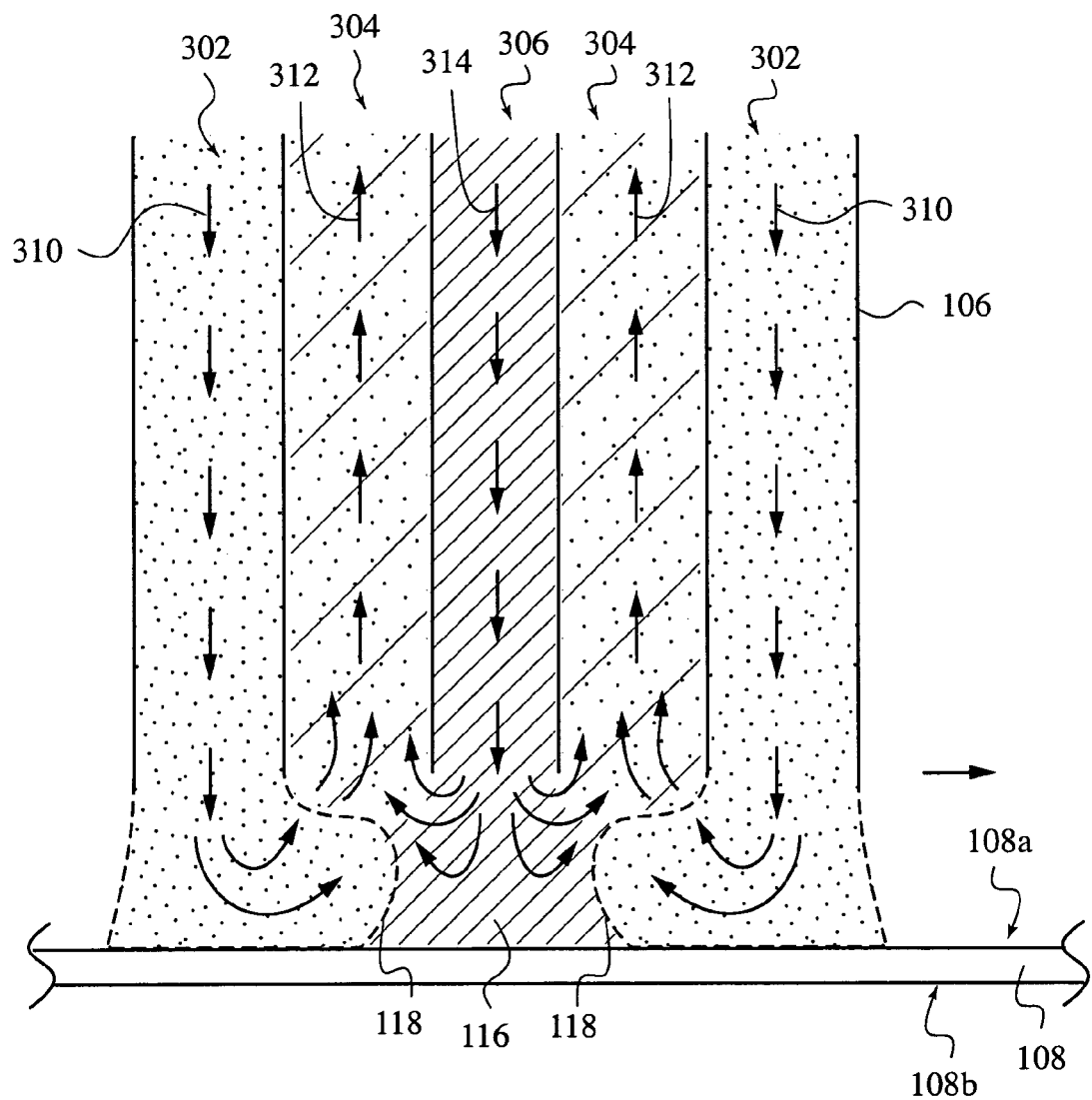
FIG. 2A illustrates a wafer processing operation that may be conducted by a proximity head in accordance with one embodiment of the present invention.

FIG. 2A illustrates a wafer processing operation that may be conducted by a proximity head 106a in accordance with one embodiment of the present invention. Although FIG. 2A shows a top surface 108a of a wafer 108 being processed, it should be appreciated that the wafer processing may be accomplished in substantially the same way for the bottom surface 108b of the wafer 108. In one embodiment, the inlet 302 may be utilized to apply isopropyl alcohol (IPA) vapor toward a top surface 108a of the wafer 108, and the inlet 306 may be utilized to apply a processing fluid toward the top surface 108a of the wafer 108. In addition, the outlet 304 may be utilized to apply vacuum to a region in close proximity to the wafer surface to remove fluid or vapor that may located on or near the top surface 108a. As described above, it should be appreciated that any suitable combination of inlets and outlets may be utilized as long as the meniscus 116 may be formed. The IPA may be in any suitable form such as, for example, IPA vapor where IPA in vapor form is inputted through use of a $N_2$ gas. Moreover, any suitable fluid used for processing the wafer (e.g., chemical precursor for ALD, chemical reactant for ALD, cleaning fluid, drying fluid, etching fluid, plating fluid, etc.) may be utilized that may enable or enhance the wafer processing. In one embodiment, an IPA inflow 310 is provided through the inlet 302, a vacuum 312 may be applied through the outlet 304 and processing fluid inflow 314 may be provided through the inlet 306. Consequently, if a fluid film resides on the wafer 108, a first fluid pressure may be applied to the wafer surface by the IPA inflow 310, a second fluid pressure may be applied to the wafer surface by the processing fluid inflow 314, and a third fluid pressure may be applied by the vacuum 312 to remove the processing fluid, IPA and fluid on the wafer surface.

Therefore, in one embodiment of a wafer processing, as the processing fluid inflow 314 and the IPA inflow 310 is applied toward a wafer surface, fluid (if any) on the wafer surface is intermixed with the processing inflow 314. At this time, the processing fluid inflow 314 that is applied toward the wafer surface encounters the IPA inflow 310. The IPA forms an interface 118 (also known as an IPA/processing fluid interface 118) with the processing fluid inflow 314 and along with the vacuum 312 assists in the removal of the processing fluid inflow 314 along with any other fluid from the surface of the wafer 108. In one embodiment, the IPA/processing fluid interface 118 reduces the surface of tension of the processing fluid. In operation, the processing fluid is applied toward the wafer surface and almost immediately removed along with fluid on the wafer surface by the vacuum applied by the outlet 304. The processing that is applied toward the wafer surface and for a moment resides in the region between a proximity head and the wafer surface along with any fluid on the wafer surface forms a meniscus 116 where the borders of the meniscus 116 are the IPA/processing fluid interfaces 118. Therefore, the meniscus 116 is a constant flow of fluid being applied toward the surface and being removed at substantially the same time with any fluid on the wafer surface. The nearly immediate removal of the processing fluid from the wafer surface prevents the formation of fluid droplets on the region of the wafer surface being dried thereby reducing the possibility of contamination on the wafer 108 after the processing fluid has accomplished its purpose depending on the operation (e.g., ALD, etching, cleaning, drying, plating, etc.). The pressure (which is caused by the flow of the gas) of the downward injection of $N_2$/IPA also helps contain the meniscus 116.

The flow of the $N_2$ carrier gas containing the IPA may assist in causing a shift or a push of processing fluid flow out of the region between the proximity head and the wafer surface and into the outlets 304 (vacuum outlets) through which the fluids may be outputted from the proximity head. It is noted that the push of processing fluid flow is not a process requirement but can be used to optimize meniscus boundary control. Therefore, as the IPA and the processing fluid are pulled into the outlets 304, the boundary making up the IPA/processing fluid interface 118 is not a continuous boundary because gas (e.g., air) is being pulled into the outlets 304 along with the fluids. In one embodiment, as the vacuum from the outlets 304 pulls the processing fluid, IPA, and the fluid on the wafer surface, the flow into the outlets 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/processing fluid interface 118. It should also be understood that the any suitable number of inlets 302, outlets 304 and inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet. It should be appreciated that as discussed above, application of $N_2$/IPA is optional depending on how close the proximity head is to the surface being processed.

It should be appreciated any suitable flow rate may be utilized for the $N_2$/IPA, processing fluid, and vacuum as long as the meniscus 116 can be maintained. In one embodiment, the flow rate of the processing fluid through a set of the inlets 306 is between about 25 ml per minute to about 3,000 ml per minute. In a preferable embodiment, the flow rate of the processing fluid through the set of the inlets 306 is about 800 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more inlets 302 and 306 and outlets 304.

In one embodiment, the flow rate of the $N_2$/IPA vapor through a set of the inlets 302 is between about 1 liters per minute (SLPM) to about 100 SLPM. In a preferable embodiment, the IPA flow rate is between about 6 and 20 SLPM.

In one embodiment, the flow rate for the vacuum through a set of the outlets 304 is between about 10 standard cubic feet per hour (SCFH) to about 1250 SCFH. In a preferable embodiment, the flow rate for a vacuum though the set of the outlets 304 is about 350 SCFH. In an exemplary embodiment, a flow meter may be utilized to measure the flow rate of the $N_2$/IPA, processing fluid, and the vacuum.

It should be appreciated that any suitable type of wafer processing operation may be conducted using the meniscus depending on the processing fluid utilized. For example, a cleaning fluid such as, for example, SC-1, SC-2, etc., may be used for the processing fluid to generate wafer cleaning operation. In a similar fashion, different fluids may be utilized and similar inlet and outlet configurations may be utilized so the wafer processing meniscus may also etch and/or plate the wafer. In one embodiment, etching fluids such as, for example, HF, EKC proprietary solution, KOH etc., may be utilized to etch the wafer. In another embodiment, plating fluids such as, for example, Cu Sulfate, Au Chloride, Ag Sulfate, etc. in conjunction with electrical input may be conducted. In yet another embodiment, a chemical precursor such as one of, for example, Titanium Fluoride, Titanium Bromide, Titanium Tetrachloride, Tantalum Fluoride, Tantalum Bromide, Ruthenium Chloride, Ruthenium Nitrate, etc., may be used with one meniscus and a corresponding chemical reactant such as, for example, Hydrazine, Hydrazones ($N_2CH_2$, $N_2CHCH_3$), hydroxyl amine, Nitrous Acid, nitrites, etc., may be used with another meniscus to conduct and ALD operation. The pH of this chemical reactant solution may be adjusted to between about 1.0 and about 5.0 and preferably to between about 3.0 to about 4.0 by adding nitric or nitrous acids. In another embodiment, the pH of this chemical reactant solution may be adjusted to between about 9.0 and about 13.0 and preferably to between about 10.0 and 11.0 by adding, for example, ammonium hydroxide or tetramethylammonium hydroxide solution. Exemplary ALD operations are discussed below in reference to FIGS. 6A to 10C.

FIG. 2B illustrates a proximity head 106 performing a wafer processing operation in accordance with one embodiment of the present invention. The proximity head 106, in one embodiment, moves while in close proximity to a top surface 108a of the wafer 108 to conduct a wafer processing operation. It should be appreciated that the proximity head 106 may also be utilized to process (e.g., ALD, clean, dry, plate, etch, etc.) a bottom surface 108b of the wafer 108. In one embodiment, the proximity head 106 may be moved in a linear fashion along the head motion while the top surface 108a is being processed. By applying the IPA 310 through the inlet 302, the vacuum 312 through outlet 304, and the processing fluid 314 through the inlet 306, the meniscus 116 may be generated. It should be appreciated that the orientation of the inlets/outlets as shown in FIG. 3 is only exemplary in nature, and that any suitable inlets/outlets orientation that may produce a stable fluid meniscus may be utilized such as those configurations as described in the United States Patent Applications incorporated by reference previously.

Figure 2C:
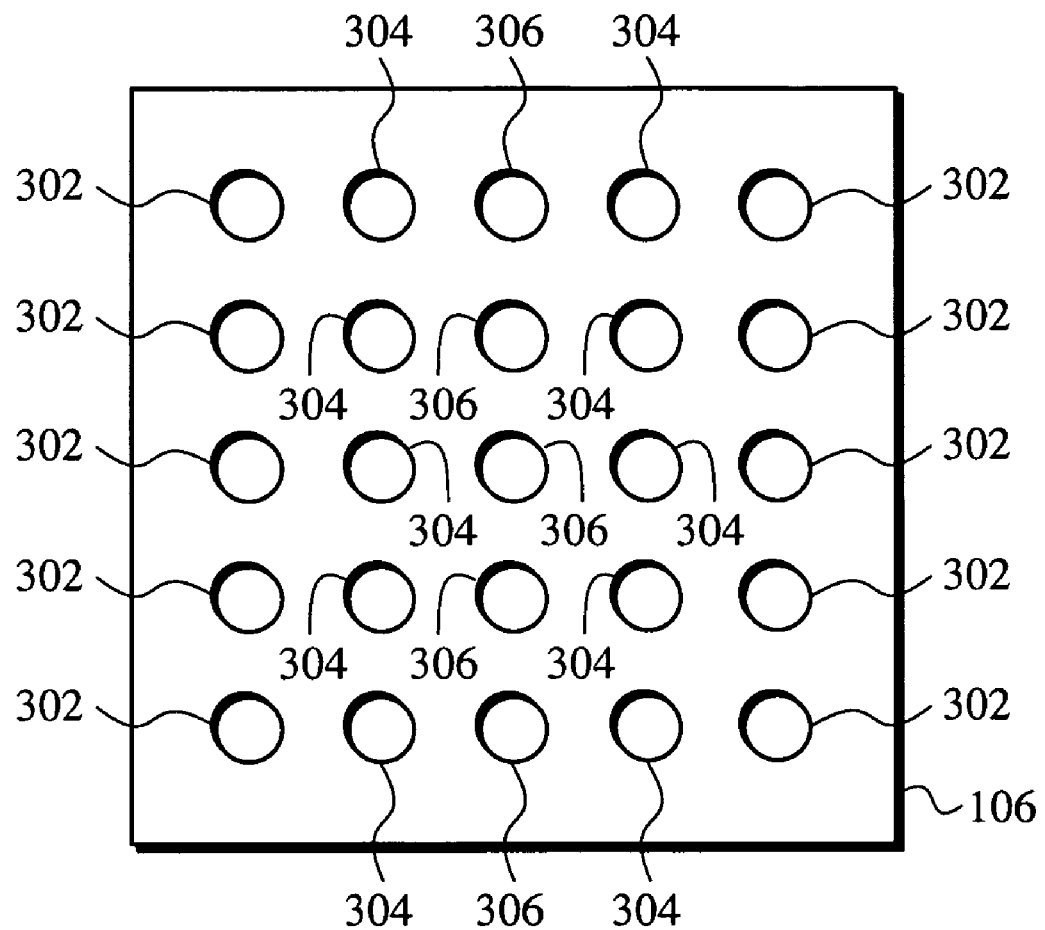
FIG. 2C shows a top view of a portion of a proximity head in accordance with one embodiment of the present invention.

FIG. 2C shows a top view of a portion of a proximity head 106 in accordance with one embodiment of the present invention. It should be appreciated that the configuration of the proximity head 106 as described in reference to FIG. 2C is exemplary in nature. Therefore, other configurations of proximity heads may be utilized to generate the fluid meniscus as long as the processing fluid can be applied to a wafer surface and removed from the wafer surface to generate a stable fluid meniscus on the wafer surface. In addition, as discussed above, other embodiments of the proximity head 106 do not have to have the source inlet 316 when the proximity head 106 is configured to generate the fluid meniscus without usage of $N_2$/IPA.

In the top view of one embodiment, from left to right are a set of the source inlet 302, a set of the source outlet 304, a set of the source inlet 306, a set of the source outlet 304, and a set of the source inlet 302. Therefore, as $N_2$/IPA and processing chemistry are inputted into the region between the proximity head 106 and the wafer 108, the vacuum removes the $N_2$/IPA and the processing chemistry along with any fluid film and/or contaminants that may reside on the wafer 108. The source inlets 302, the source inlets 306, and the source outlets 304 described herein may also be any suitable type of geometry such as for example, circular opening, triangle opening, square opening, etc. In one embodiment, the source inlets 302 and 306 and the source outlets 304 have circular openings. It should be appreciated that the proximity head 106 may be any suitable size, shape, and/or configuration depending on the size and shape of the fluid meniscus 106 desired to generated. In one embodiment, the proximity head may extend less than a radius of the wafer. In another embodiment, the proximity head may be extend more than the radius of the wafer. In another embodiment, the proximity head may extend greater than a diameter of the wafer. Therefore, the size of the fluid meniscus may be any suitable size depending on the size of a wafer surface area desired to be processed at any given time. In addition, it should be appreciated that the proximity head 106 may be positioned in any suitable orientation depending on the wafer processing operation such as, for example, horizontally, vertically, or any other suitable position in between. The proximity head 106 may also be incorporated into a wafer processing system where one or more types of wafer processing operations may be conducted.

Figure 3:
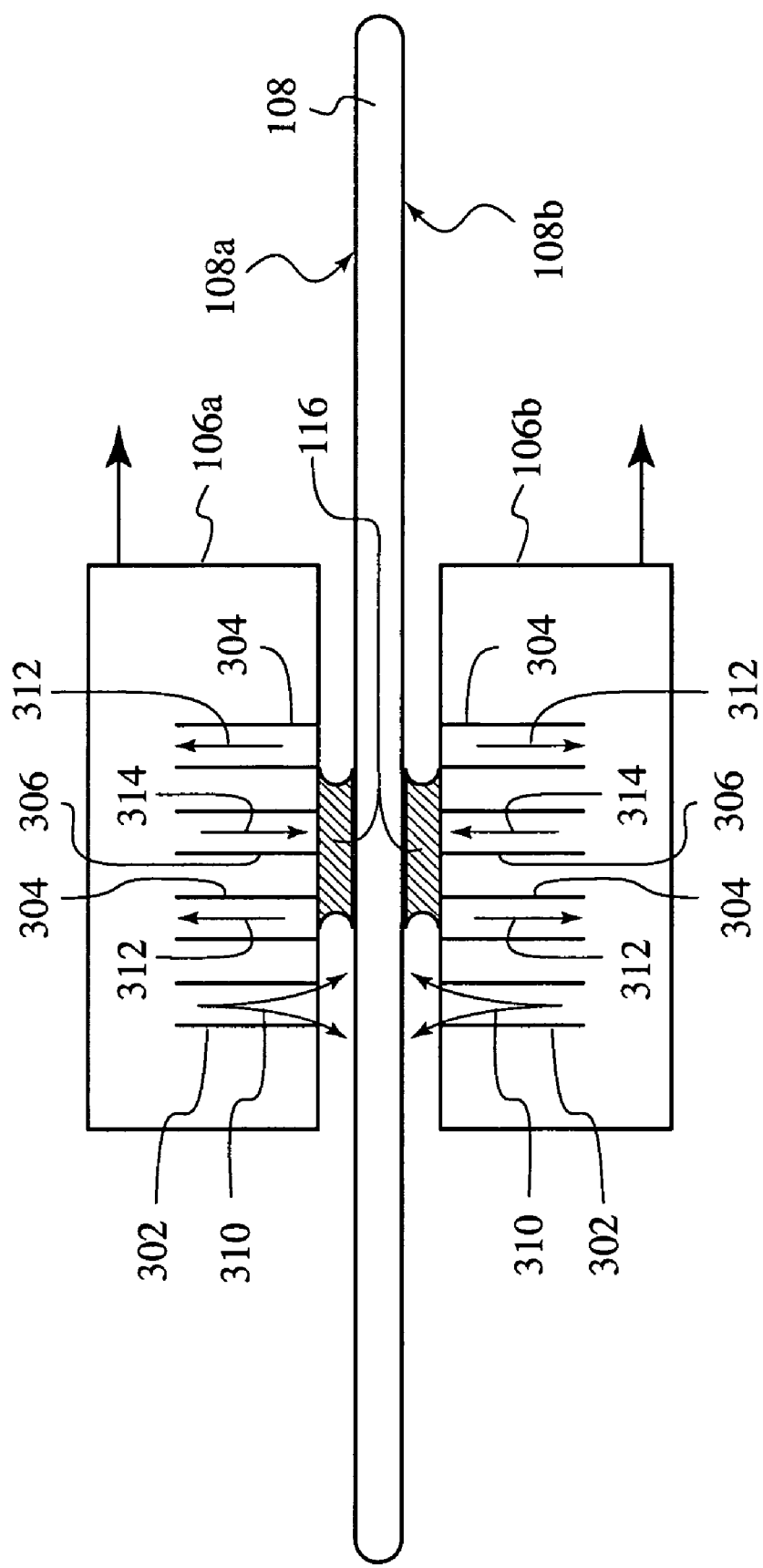
FIG. 3 illustrates a side view of exemplary proximity heads for use in a dual wafer surface processing system in accordance with one embodiment of the present invention.

FIG. 3 illustrates a side view of exemplary proximity heads 106 and 106b for use in a dual wafer surface processing system in accordance with one embodiment of the present invention. In this embodiment, by usage of inlets 302 and 306 to input $N_2$/IPA and processing respectively along with the outlet 304 to provide a vacuum, the meniscus 116 may be generated. In addition, on the side of the inlet 306 opposite that of the inlet 302, there may be the outlet 304 to remove processing fluid and to keep the meniscus 116 intact. As discussed above, in one embodiment, the inlets 302 and 306 may be utilized for IPA inflow 310 and processing fluid inflow 314 respectively while the outlet 304 may be utilized to apply vacuum 312. In addition, in yet more embodiments, the proximity heads 106 and 106b may be of a configuration as shown in the United States Patent Applications referenced above. Any suitable surface coming into contact with the meniscus 116 such as, for example, wafer surfaces 108a and 108b of the wafer 108 may be processed by the movement of the meniscus 116 into and away from the surface.

Figure 4A:
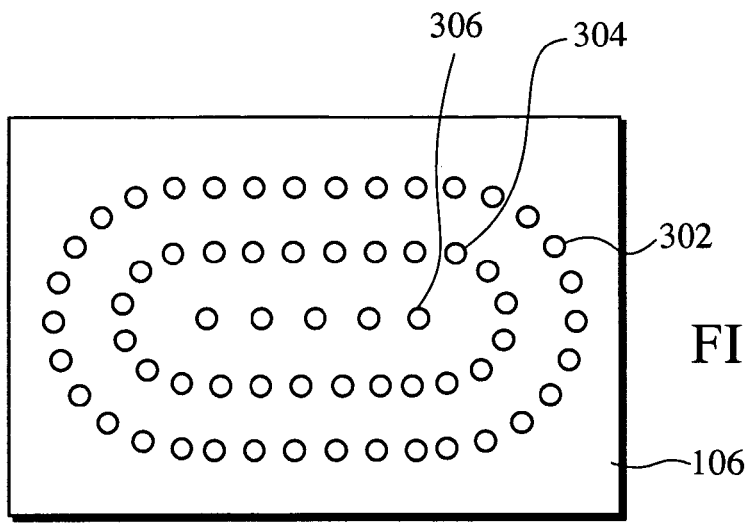
FIG. 4A illustrates an inlets/outlets pattern of a proximity head in accordance with one embodiment of the present invention.

FIG. 4A illustrates an inlets/outlets pattern of a proximity head 106 in accordance with one embodiment of the present invention. In this embodiment, the proximity head 106 includes the source inlets 302 and 306 as well as source outlets 304. In one embodiment, the source outlets 304 may surround the source inlets 306 and the source inlets 302 may surround the source outlets 304.

Figure 4B:
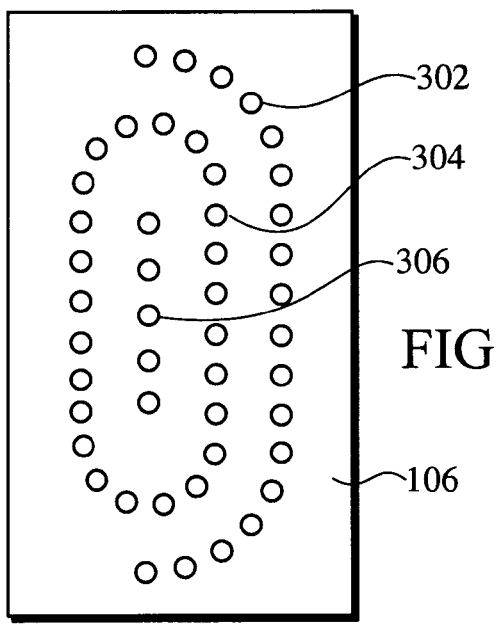
FIG. 4B illustrates another inlets/outlets pattern of a proximity head in accordance with one embodiment of the present invention.

FIG. 4B illustrates another inlets/outlets pattern of a proximity head 106 in accordance with one embodiment of the present invention. In this embodiment, the proximity head 106 includes the source inlets 302 and 306 as well as source outlets 304. In one embodiment, the source outlets 304 may surround the source inlets 306 and the source inlets 302 may at least partially surround the source outlets 304.

Figure 4C:
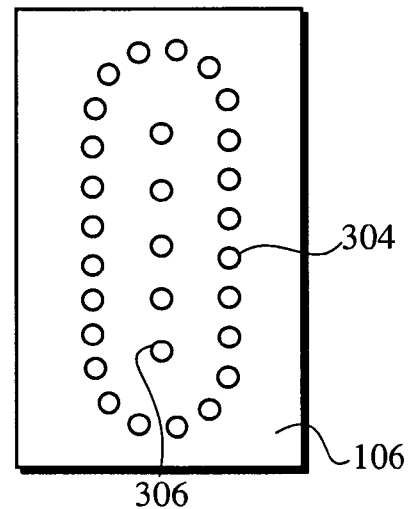
FIG. 4C illustrates a further inlets/outlets pattern of a proximity head in accordance with one embodiment of the present invention.

FIG. 4C illustrates a further inlets/outlets pattern of a proximity head 106 in accordance with one embodiment of the present invention. In this embodiment, the proximity head 106 includes the source inlets 302 and 306 as well as source outlets 304. In one embodiment, the source outlets 304 may surround the source inlets 306. In one embodiment, the proximity head 106 does not include source inlets 302 because, in one embodiment, the proximity head 106 is capable of generating a fluid meniscus without application of IPA/$N_2$. It should be appreciated that the above described inlets/outlets patterns are exemplary in nature and that any suitable type of inlets/outlets patterns may be used as long as a stable and controllable fluid meniscus can be generated.

Figure 5A:
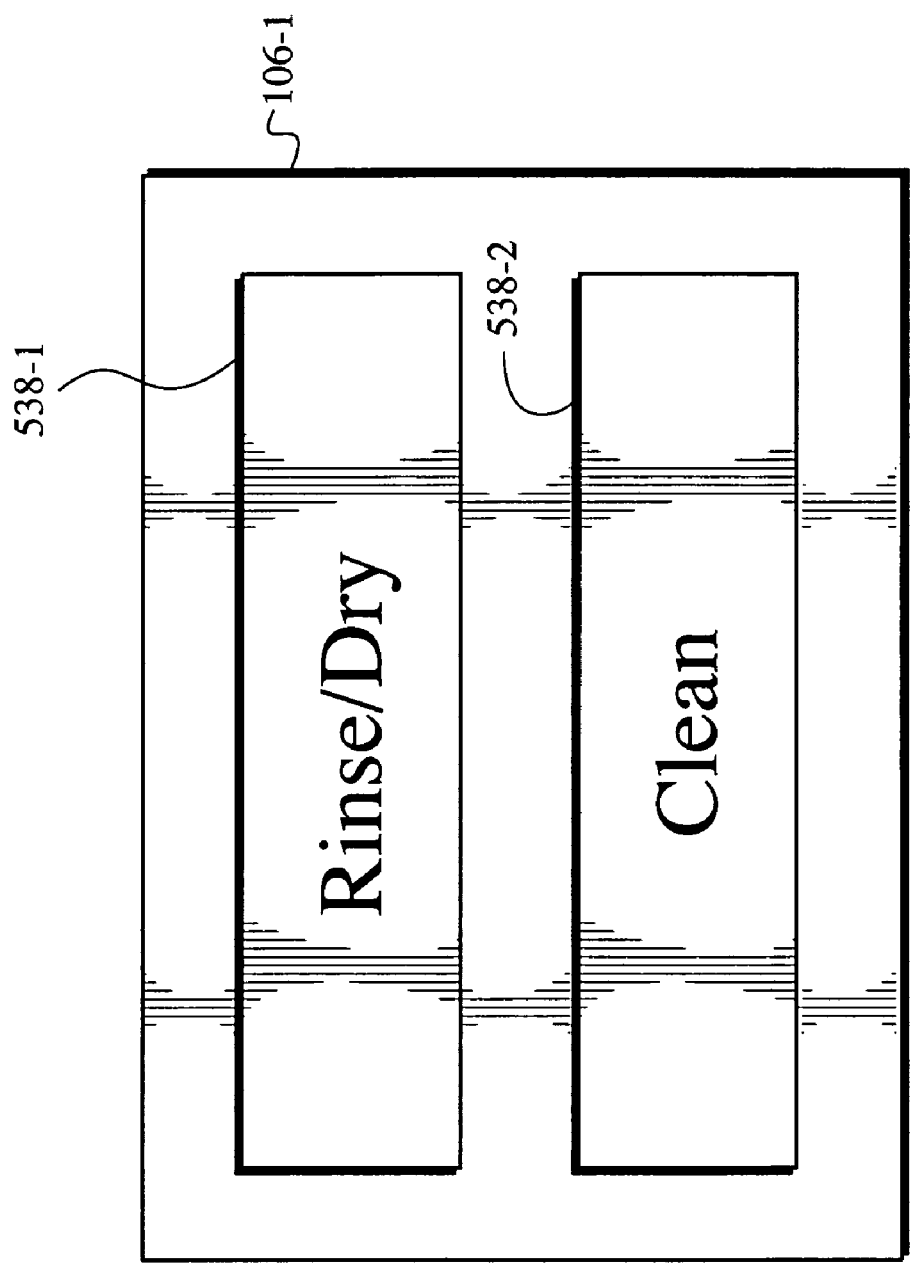
FIG. 5A shows a multi-process window proximity head in accordance with one embodiment of the present invention.

FIG. 5A shows a multi-process window proximity head 106-1 in accordance with one embodiment of the present invention. The proximity head 106-1 includes two process windows 538-1 and 538-2. In one embodiment, the process window 538-2 may use cleaning fluids instead of DIW to clean wafers. The process window 538-2 may use any suitable configuration of source inlets and outlets that may apply any suitable type of cleaning fluid to the wafer. In one embodiment, the process window 538-2 may include only source inlets that may apply the cleaning fluid. In another embodiment, the process window 538-2 may include other configurations and functions of source inlets and outlets described herein.

The process window 538-1 may then dry the wafer. The process window 538-1 may use any suitable configurations of source inlets and source outlets consistent with the configurations and functions described herein for drying a wafer surface. Therefore, by use of multiple process windows multiple functions such as cleaning and drying may be accomplished by one proximity head. In yet another embodiment, instead of multiple process windows being located on one proximity head, multiple proximity heads may be utilized to process the wafer where, for example, one proximity head may clean the wafer and another proximity head may dry the wafer according to the apparatuses and methodology described herein.

Figure 5B:
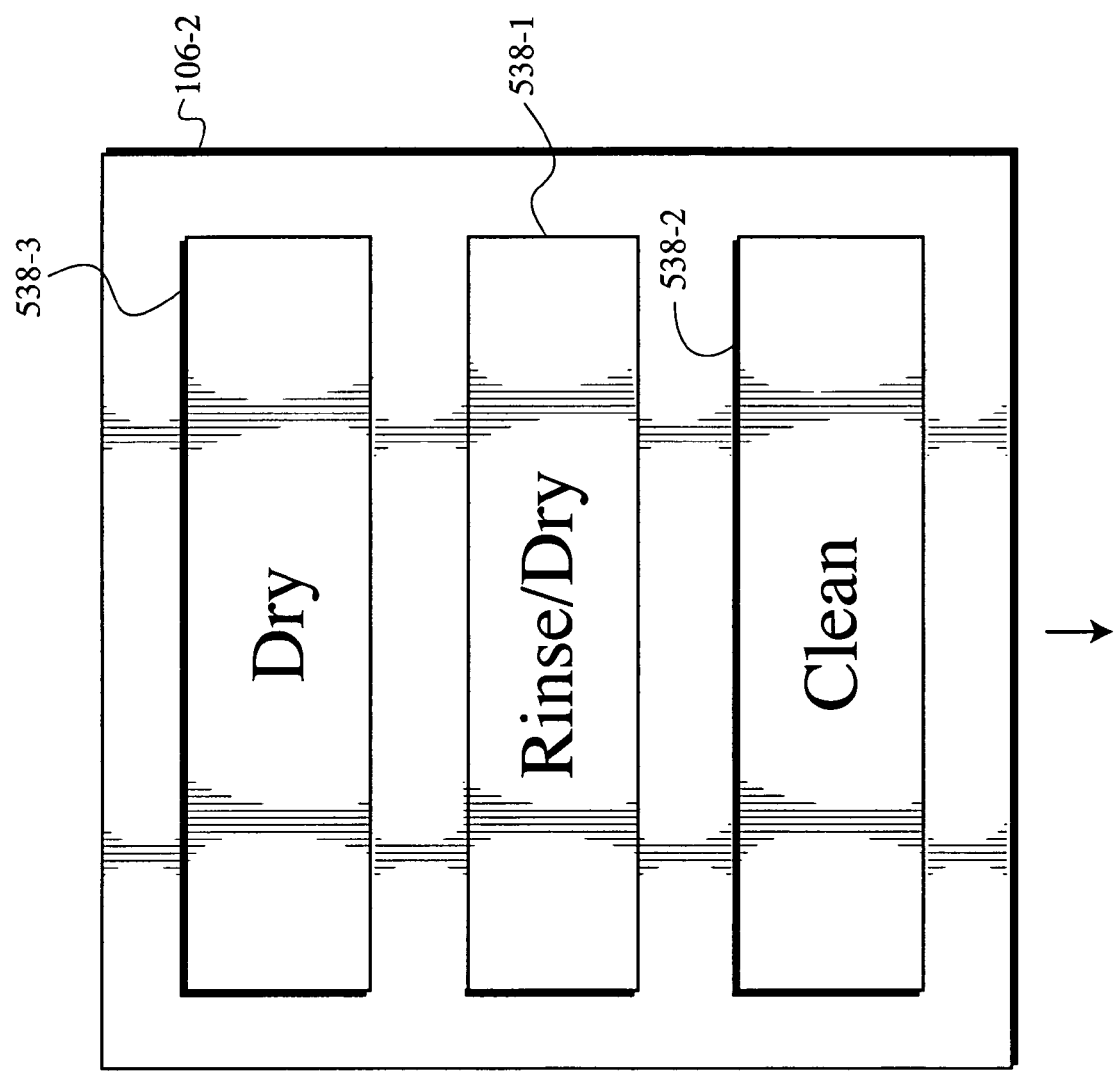
FIG. 5B shows a multi-process window proximity head with three process windows in accordance with one embodiment of the present invention.

FIG. 5B shows a multi-process window proximity head 106-2 with three process windows in accordance with one embodiment of the present invention. It should be appreciated that the proximity head 106-2 may include any suitable number of processing windows depending on the number and types of processing desired to be accomplished by the proximity head 106-2. In one embodiment, the proximity head 106-2 includes a process window 538-1, 538-2, and 538-3. In one embodiment, the process window 538-1, 538-2, and 538-3 are cleaning, rinsing/drying, and drying process windows respectively. In one embodiment, the process window 538-1 may form a meniscus made up of DIW to rinse a wafer surface. The process window 538-2 may generate a cleaning fluid meniscus to clean a wafer surface. The process windows 538-1 and 538-2 includes at least one source inlet 306 to apply fluid to the wafer surface. In one embodiment, the process windows 538-1 and 538-2 may optionally include source inlet 302 and source outlet 304 to generate a stable and controllable fluid meniscus. The process window 538-3 may generate the fluid meniscus 116 to dry the wafer. It should be appreciated that the process window 538-3 both rinses and dries the wafer surface because the fluid meniscus is made up of DIW. Therefore, different types of process windows may be included in the proximity head 106-2. As discussed in reference to FIG. 5B above, instead of having multiple process windows in one proximity head, multiple proximity heads may be used where one or more of the proximity heads may be used for different purposes such as cleaning, rinsing, drying, plating, plating, ALD, etc.

Figure 6A:
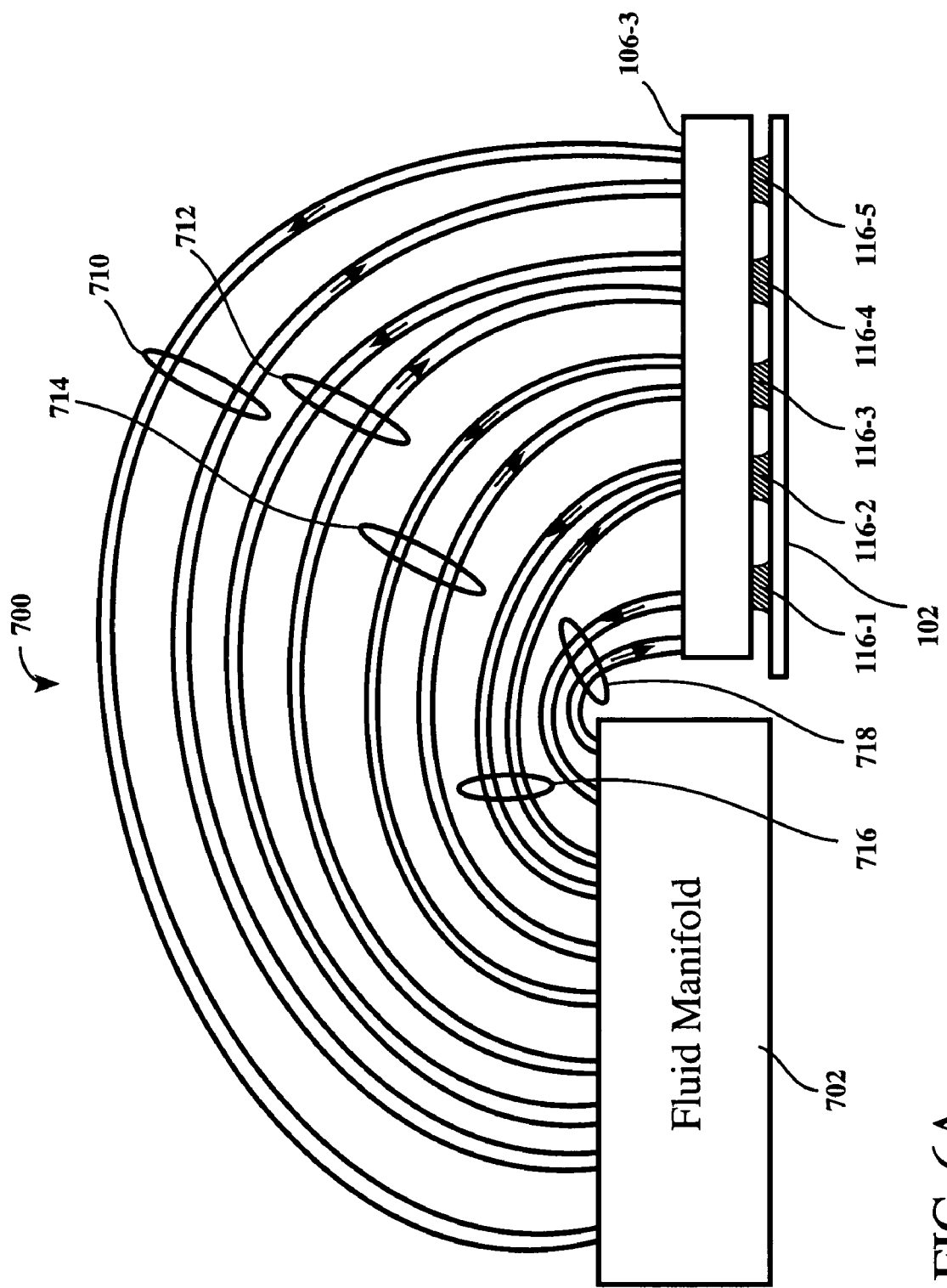
FIG. 6A illustrates an atomic layer deposition system in accordance with one embodiment of the present invention.

FIG. 6A illustrates an atomic layer deposition system 700 in accordance with one embodiment of the present invention. In one embodiment, the system 700 includes a manifold 702 that can provide fluids to and receive fluids from a proximity head 106-3. The proximity head 106-3 may include multiple process windows with conduits that can generate menisci 116-1, 116-2, 116-3, 116-4, and 116-5. It should be appreciated that although 5 menisci are shown as being generated, other proximity heads may be utilized that can generate any suitable number of menisci such as, for example, 1, 2, 3, 4, 5, 6, 7, 8, 9, 10, etc.

In one embodiment, the menisci 116-1, 116-2, 116-3, 116-4, and 116-5 can be utilized to process a surface of the wafer 108 in an ALD operation. In one embodiment, tubes 718, 716, 714, 712, and 710 can supply fluids to and receive fluids from conduits in the proximity head 106-3 to generate the menisci 116-1, 116-2, 116-3, 116-4, and 116-5 respectively on the wafer 108. Depending on the type of operation each of the menisci 116-1, 116-2, 116-3, 116-4, and 116-5 are utilized for, the fluids supplied to and received from the menisci through the tubes 718, 716, 714, 712, and 710 may be any suitable fluids appropriate for the particular operation. In one embodiment, the fluid menisci 116-1, 116-2, 116-3, 116-4, and 116-5 are utilized for an ALD operation. Therefore, the menisci 116-1, 116-2, 116-3, 116-4, and 116-5 may conduct rinsing, application of chemical-1, rinsing, application of chemical-2, and rinsing operations respectively. In such an embodiment, the chemical-1 may be a chemical precursor that can react with a reactant such as chemical-2 to generate a layer of material on the wafer surface. In one embodiment, to generate a layer of Titanium Nitride (or Tantalum Nitride) the chemical precursor may be Titanium Fluoride (or Tantalum Fluoride when tantalum nitride is desired to be generated) and the chemical reactant may be, for example, Hydrazine, Hydrazones, Hydroxyl Amine, Nitrous Acid, etc. The pH of this chemical reactant solution may be adjusted to between about 1.0 and about 5.0 and preferably to between about 3.0 and about 4.0 by adding nitric or nitrous acids. In another embodiment, the pH of this chemical reactant solution may be adjusted to between about 9.0 and about 13.0 and preferably to between about 10.0 and about 11.0 by adding ammonium hydroxide or tetramethylammonium hydroxide solution. It should be appreciated that the materials discussed as being generated is exemplary in nature and the methodologies and apparatuses described herein may generate any suitable material when certain suitable chemical precursors and chemical reactants are utilized.

Therefore, the system 700 can apply the fluid meniscus 116-1 to rinse the wafer in preparation for ALD. In one embodiment, the fluid meniscus 116-1 may apply deionized water (DIW) to the wafer surface to rinse the surface. In another embodiment, the fluid meniscus 116-1 may apply a cleaning fluid to the wafer surface to clean the surface.

Then the fluid meniscus 116-2 can apply the chemical precursor of the material to be deposited to the surface of the wafer. As discussed above, in one embodiment, the chemical precursor may be Titanium Fluoride, Titanium Bromide, Titanium Tetrachloride or Tantalum Fluoride. The chemical precursor may be any suitable chemical that can react with another chemical to deposit a layer of a desired material.

After the fluid meniscus 116-2 has applied the chemical precursor to the wafer surface, the fluid meniscus 116-3 can be moved over the region of the wafer surface to rinse off the chemical precursor except for an atomic layer of the chemical precursor. In one embodiment, the fluid meniscus 116-3 may apply any suitable fluid that can leave an atomic layer of the chemical precursor on the wafer surface. In one embodiment depending on the chemical precursor, the fluid meniscus 116-3 can apply DIW to the wafer surface to remove most of the chemical precursor thus leaving an atomic layer of the chemical precursor on the wafer surface. In another embodiment, depending on chemical precursor, the fluid meniscus 116-3 can apply an organic solvent to the wafer surface to remove most of the chemical precursor thus leaving an atomic layer of the chemical precursor on the wafer surface. In one embodiment, the organic solvent may be, for example, carbon tetrachloride, anhydrous iso-propanol, anhydrous propanol, or anhydrous ethanol.

Then the fluid meniscus 116-4 can apply a chemical reactant such as, for example, Hydrazine, Hydrazones, Hydroxyl Amine, Nitrous Acid etc. The pH of this chemical reactant solution may be adjusted to between about 1.0 and about 5.0 and preferably to between about 3.0 and about 4.0 by adding nitric or nitrous acids. In another example, The pH of this chemical reactant solution may be adjusted to between 9.0 and about 13.0 and preferably to between about 10.0 and about 11.0 by adding ammonium hydroxide or tetramethylammonium hydroxide solution. The chemical reactant can react with the atomic layer of the chemical precursor on the wafer surface to generate a layer of a material generated by the reaction between the chemical precursor and the chemical reactant. Because the chemical precursor on the wafer surface was an atomic layer, the layer of the material deposited on the wafer surface by the reaction is limited by the amount of the chemical precursor on the wafer surface.

After generation of a layer of the desired material through the reaction between the chemical precursor and the chemical reactant, the fluid meniscus 116-5 may be applied to the wafer surface to clean any excess chemical reactant off of the wafer surface. It should be appreciated that any fluid that can remove any fluids on the wafer surface can be applied by the fluid meniscus 116-5. In one embodiment, DIW or a cleaning solution may be applied to the wafer surface by the fluid meniscus 116-5. After the layer of the desired material has been deposited, the proximity head 106-3 may be moved over the wafer surface again to deposit a second layer of the desired material. As can be seen, any suitable number of layers of the desired material may be deposited on the wafer surface by moving the fluid menisci 116-1, 116-2, 116-3, 116-4, 116-5 over the wafer surface a corresponding number of times.

Figure 6B:
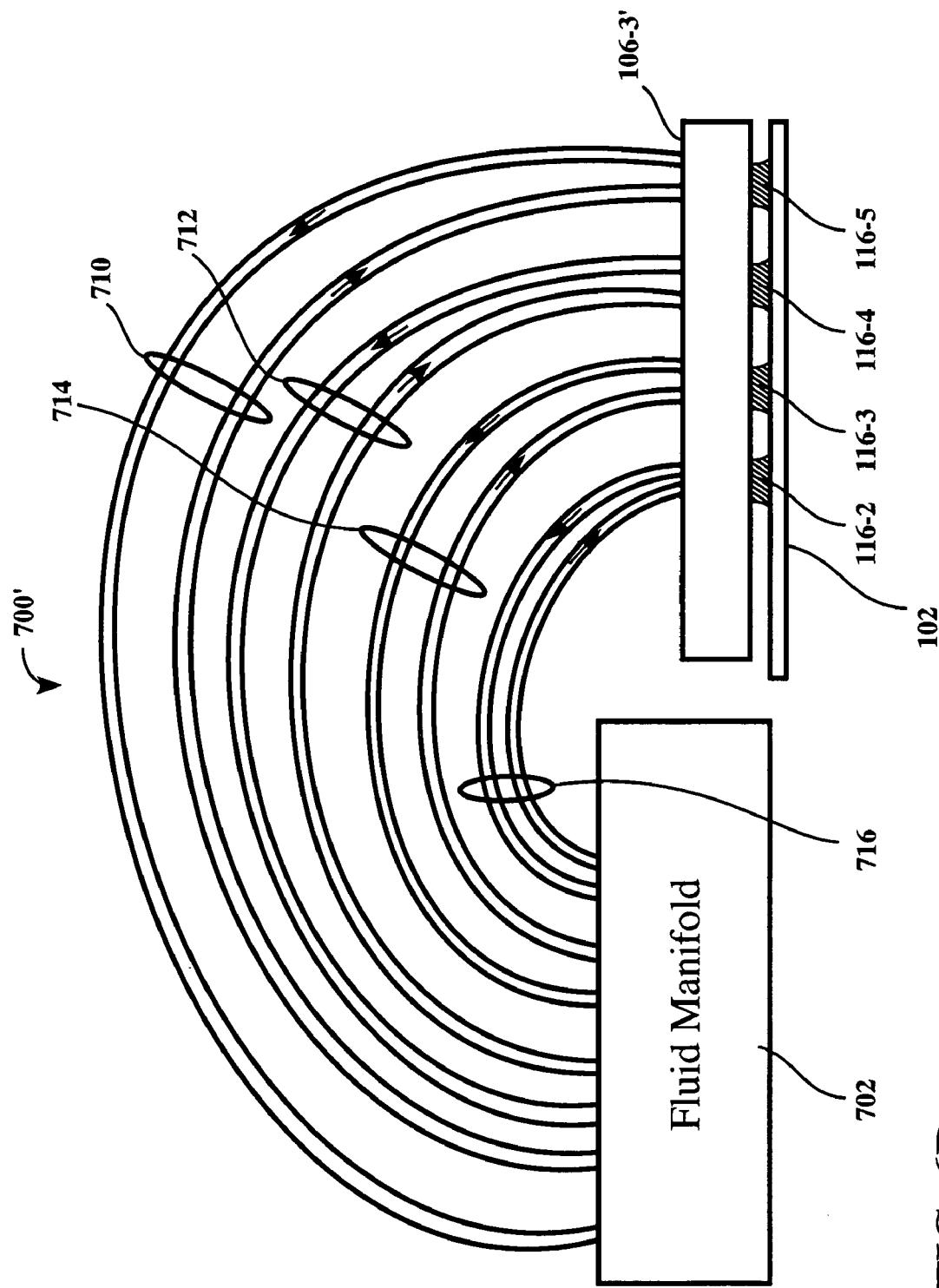
FIG. 6B shows another atomic layer deposition system in accordance with one embodiment of the present invention.

FIG. 6B shows another atomic layer deposition system 700' in accordance with one embodiment of the present invention. In one embodiment, the system 700' includes a manifold 702 that can provide fluids to and receive fluids from a proximity head 106-3'. The proximity head 106-3' may include multiple process windows with conduits that can generate menisci 116-2, 116-3, 116-4, and 116-5. It should be appreciated that although 4 menisci are shown as being generated, other proximity heads may be utilized that can generate any suitable number of menisci such as, for example, 1, 2, 3, 4, 5, 6, 7, 8, 9, 10, etc. In one embodiment, the menisci 116-2, 116-3, 116-4, and 116-5 can be utilized to process a surface of the wafer 108. In one embodiment, tubes 716, 714, 712, and 710 can supply fluids to and receive fluids from menisci 116-2, 116-3, 116-4, and 116-5 respectively. Depending one the type of operation each of the menisci 116-2, 116-3, 116-4, and 116-5 are utilized for, the fluids supplied to and received from the menisci through the tubes 716, 714, 712, and 710 may be any suitable fluids appropriate for the particular operation. In one embodiment, the fluid menisci 116-2, 116-3, 116-4, and 116-5 are utilized for an ALD operation. Therefore, the menisci 116-2, 116-3, 116-4, and 116-5 may conduct applying chemical-1, rinsing, applying chemical-2, and rinsing operations respectively operations respectively. In this embodiment, the ALD may occur as discussed above in reference to FIG. 6A except the fluid meniscus 116-1 is not used to rinse the substrate in preparation for ALD.

FIG. 6C illustrates yet another atomic layer deposition system 700" in accordance with one embodiment of the present invention. In one embodiment, the system 700" includes a manifold 702 that can provide fluids to and receive fluids from a proximity head 106-3". The proximity head 106-3" may include multiple process windows with conduits that can generate menisci 116-2, 116-3, and 116-4. It should be appreciated that although 3 menisci are shown as being generated, other proximity heads may be utilized that can generate any suitable number of menisci such as, for example, 1, 2, 3, 4, 5, 6, 7, 8, 9, 10, etc. In one embodiment, the menisci 116-2, 116-3, and 116-4 can be utilized to process a surface of the wafer 108. In one embodiment, tubes 716, 714, and 712 can supply fluids to and receive fluids from menisci 116-2, 116-3, and 116-4 respectively. Depending one the type of operation each of the menisci 116-2, 116-3, and 116-4 are utilized for, the fluids supplied to and received from the menisci through the tubes 716, 714, and 712 may be any suitable fluids appropriate for the particular operation. In one embodiment, the fluid menisci 116-2, 116-3, and 116-4 are utilized for an ALD operation. Therefore, the menisci 116-2, 116-3, and 116-4 may conduct the application of chemical-1, rinsing, and the application of chemical-2 respectively operations respectively. In this embodiment, the ALD may occur as discussed above in reference to FIG. 6A except the fluid meniscus 116-1 is not used to rinse the substrate in preparation for ALD and the fluid meniscus 116-5 is not used to rinse the excess chemical reactant from the wafer surface.

Figure 7A:
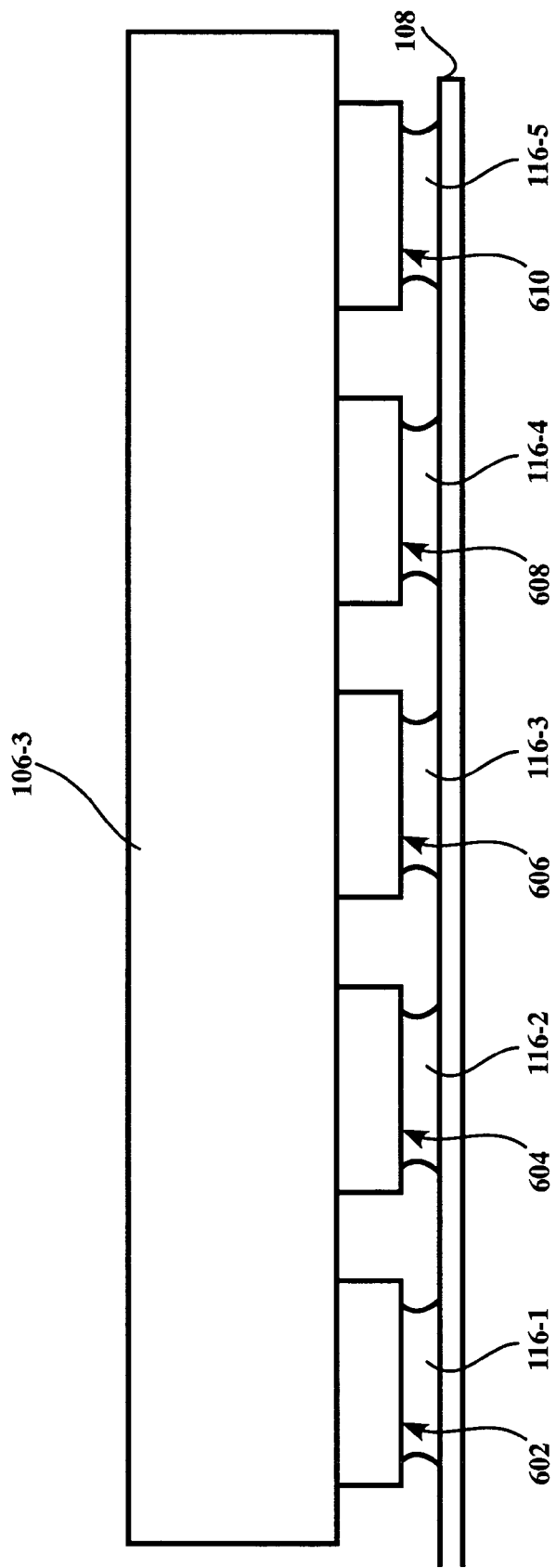
FIG. 7A illustrates a side view of the proximity head configured to conduct an ALD operation in accordance with one embodiment of the present invention.
Figure 7B:
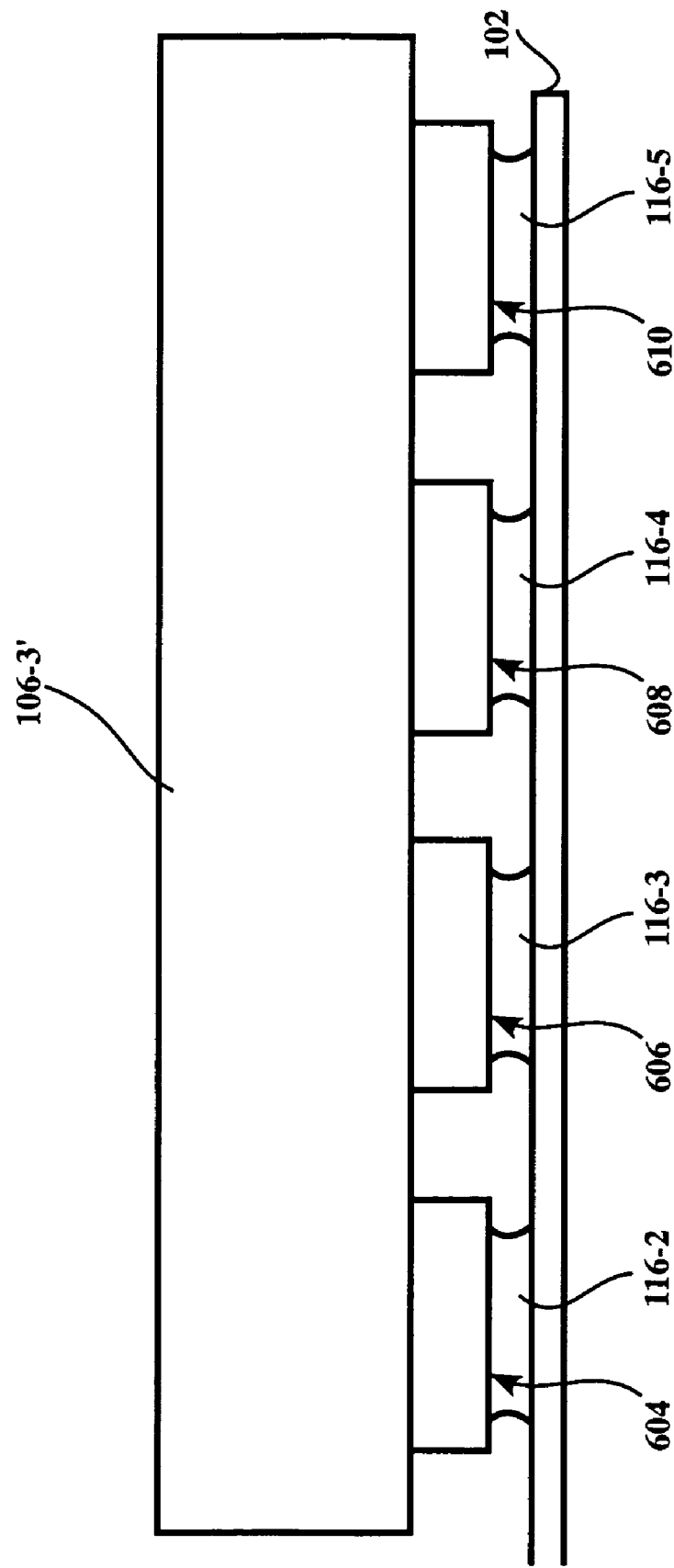
FIG. 7B illustrates a side view of the proximity head configured to conduct an ALD operation in accordance with one embodiment of the present invention.
Figure 7C:
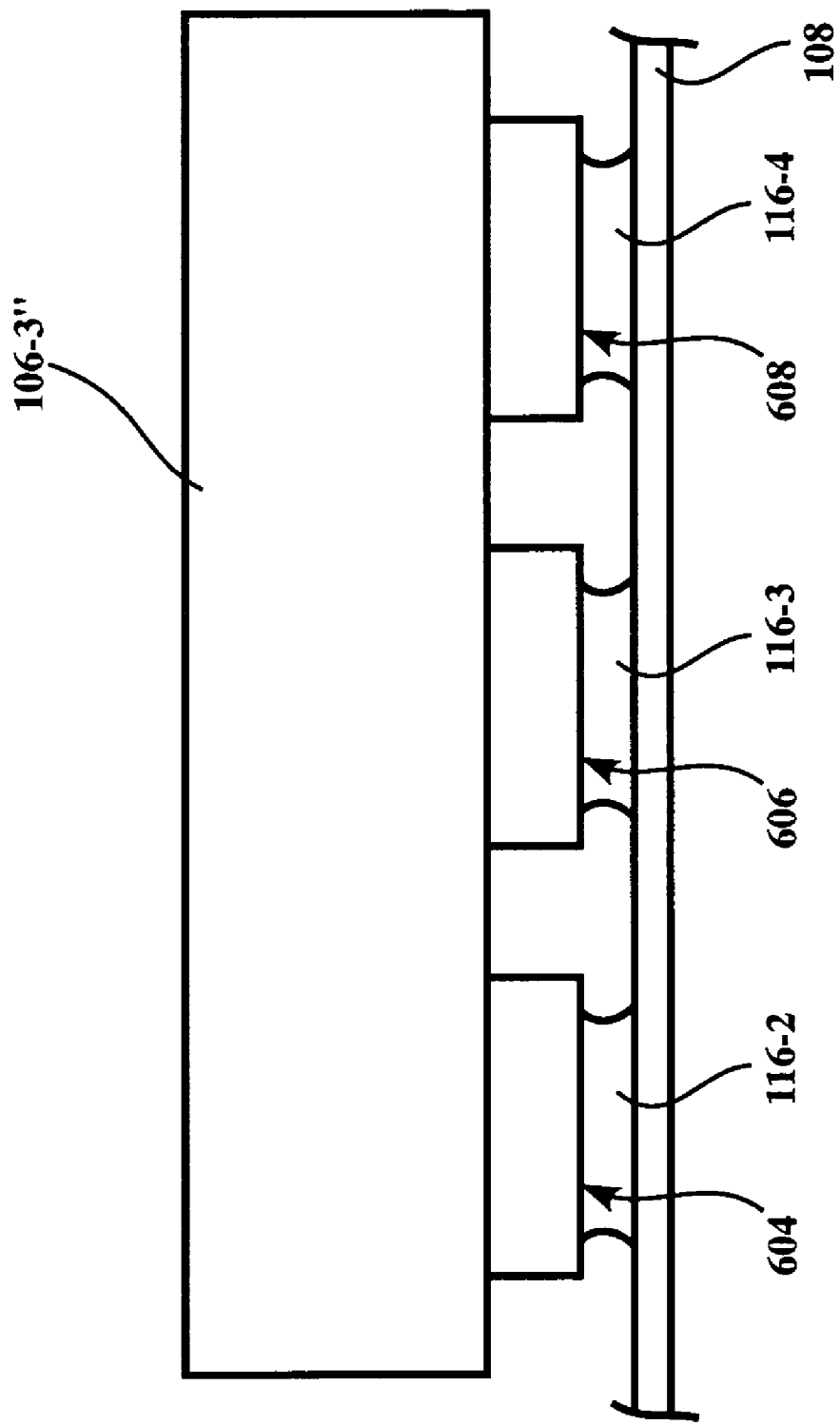
FIG. 7C illustrates a side view of the proximity head configured to conduct an ALD operation in accordance with one embodiment of the present invention.

FIGS. 7A through 7C illustrate exemplary proximity heads that can each generate multiple menisci to accomplish atomic layer deposition on the surface of the wafer 102. It should be appreciated that although the multiple menisci are shown to be generated by one proximity head, in other embodiments, each of the menisci may be generated by a corresponding proximity head. Therefore, in such an embodiment, one proximity head may follow another proximity head to process the wafer surface. Therefore, one proximity head can generate a fluid meniscus 116-1, a second proximity head can generate the fluid meniscus 116-2, a third proximity head can generate the fluid meniscus 116-3, a fourth proximity head can generate the fluid meniscus 116-4 and a fifth proximity head can generate the fluid meniscus 116-5.

FIG. 7A illustrates a side view of the proximity head 106-3 configured to conduct an ALD operation in accordance with one embodiment of the present invention. In one embodiment, the proximity head 106-3 includes multiple process windows. In one embodiment, each of the process windows include a set of conduits for applying a processing fluid to a substrate surface, a set of conduits for removing at least the processing fluid from the substrate surface, and a set of conduits for applying a surface tension reducing fluid to the borders of the meniscus formed by the particular process window. The proximity head 106-3, in one embodiment, includes process windows 602, 604, 606, 608, and 610. In one embodiment, the process windows 602, 604, 606, 608, and 610 each include a set of conduits capable of forming the fluid menisci 116-1, 116-2, 116-3, 116-4, and 116-5. As discussed in the above figures, each of the fluid menisci 116-1, 116-2, 116-3, 116-4, and 116-5 may be generated by applying fluids from fluid inlets to the surface of the wafer 102 and by removing fluids from the fluid outlets.

FIG. 7B illustrates a side view of the proximity head 106-3' configured to conduct an ALD operation in accordance with one embodiment of the present invention. In one embodiment, the proximity head 106-3' includes multiple process windows. In one embodiment, each of the process windows include a set of conduits for applying a processing fluid to a substrate surface, a set of conduits for removing at least the processing fluid from the substrate surface, and a set of conduits for applying a surface tension reducing fluid to the borders of the meniscus formed by the particular process window. The proximity head 106-3', in one embodiment, includes process windows 604, 606, 608, and 610. In one embodiment, the process windows 604, 606, 608, and 610 each include a set of conduits capable of forming the fluid menisci 116-2, 116-3, 116-4, and 116-5. As discussed in the above figures, each of the fluid menisci 116-2, 116-3, 116-4, and 116-5 may be generated by applying fluids from fluid inlets to the surface of the wafer 102 and by removing fluids from the fluid outlets.

FIG. 7C illustrates a side view of the proximity head 106-3" configured to conduct an ALD operation in accordance with one embodiment of the present invention. In one embodiment, the proximity head 106-3" includes multiple process windows. In one embodiment, each of the process windows include a set of conduits for applying a processing fluid to a substrate surface, a set of conduits for removing at least the processing fluid from the substrate surface, and a set of conduits for applying a surface tension reducing fluid to the borders of the meniscus formed by the particular process window. The proximity head 106-3", in one embodiment, includes process windows 604, 606, and 608. In one embodiment, the process windows 604, 606, and 608 each include a set of conduits capable of forming the fluid menisci 116-2, 116-3, and 116-4. As discussed in the above figures, each of the fluid menisci 116-2, 116-3, and 116-4 may be generated by applying fluids from fluid inlets to the surface of the wafer 102 and by removing fluids from the fluid outlets.

Figure 8:
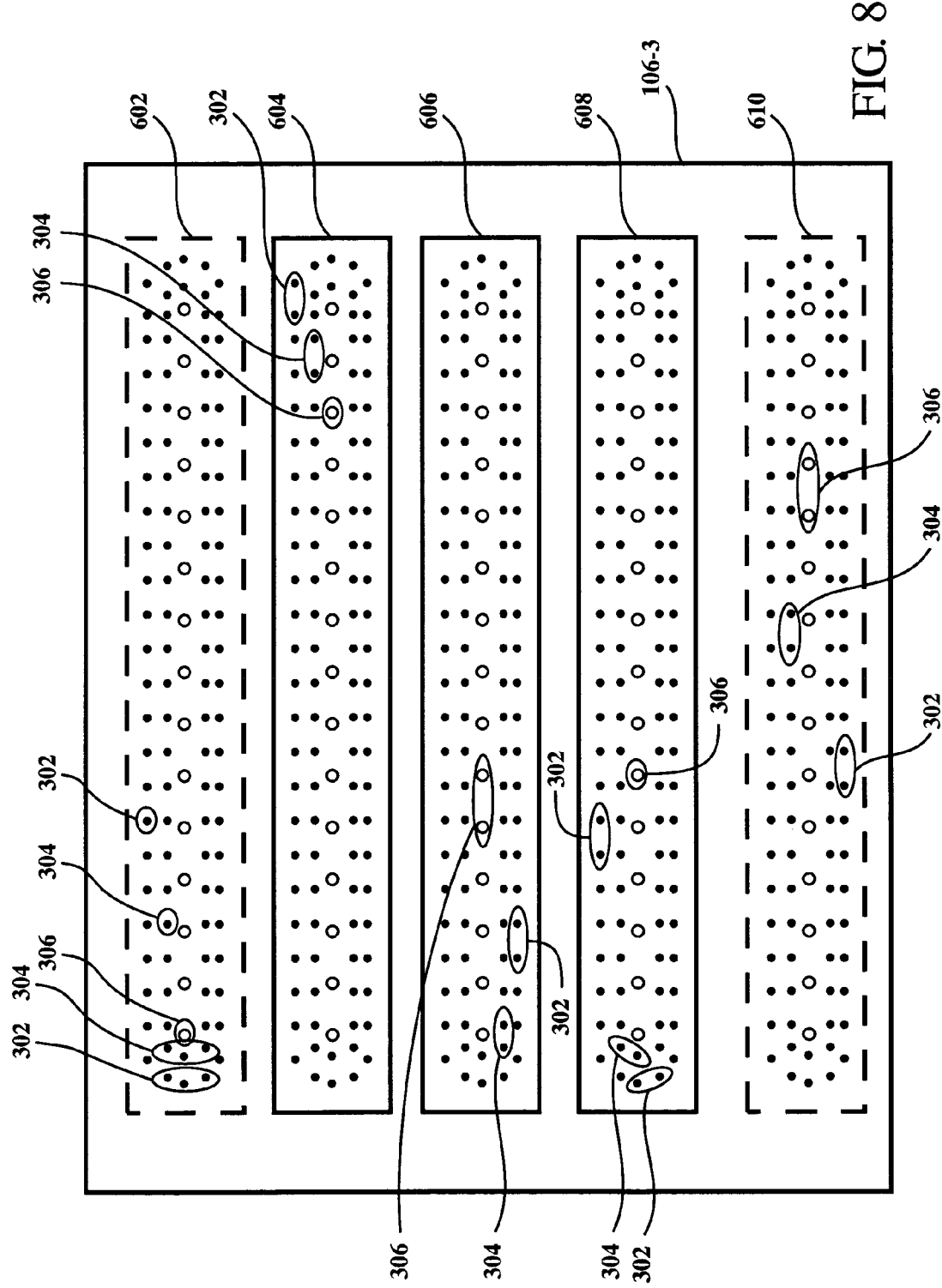
FIG. 8 illustrates process windows of the proximity head in accordance with one embodiment of the present invention.

FIG. 8 illustrates process windows of the proximity head 106-3 in accordance with one embodiment of the present invention. In one embodiment, the proximity head 106-3 includes process windows 602, 604, 606, 608, 610. In one embodiment, the process windows 602, 604, 606, 608, 610 may each include a set of conduits which can include the inlets 306 and 302 as well as the outlets 304. The process windows 602, 604, 606, 608, 610 may each therefore generate respective fluid menisci on a substrate surface by applying a processing fluid from the inlets 306, applying vacuum from the outlets 304, and optionally IPA/$N_2$ from the inlets 302. It should be appreciated that the conduit pattern within each of the processing windows 602, 604, 606, 608, 610 are exemplary in nature. Therefore, each of the process windows 602, 604, 606, 608, 610 may have the same or different conduit pattern depending on the operation(s) desired to be conducted by the proximity head 106-3. In addition, as shown in FIG. 8, process windows 602 and/or 610 may be optionally used as shown by the dashed outlines.

FIG. 9A shows an exemplary ALD operation in accordance with one embodiment of the present invention. The proximity head 106-3, may in one embodiment, be configured to generate the fluid menisci 116-1, 116-2, 116-3, and 116-4, and 116-5. In one embodiment, the proximity head 106-3 and/or the wafer 102 may be moved in such a way that the fluid menisci 116-1, 116-2, 116-3, 116-4, 116-5 may be moved over a certain portion of the surface of the wafer 102 in order. Therefore, in one example, the surface of the wafer may be scanned by 116-1, 116-2, 116-3, 116-4, 116-5 in that order. FIG. 9A shows the proximity head 106-3 as it is about to process the surface of the wafer 108. As shown in FIG. 9A, the fluid menisci 116-1 and/or 116-5 may be optionally utilized or not utilized depending on the implementation of the ALD process.

Figure 9B:
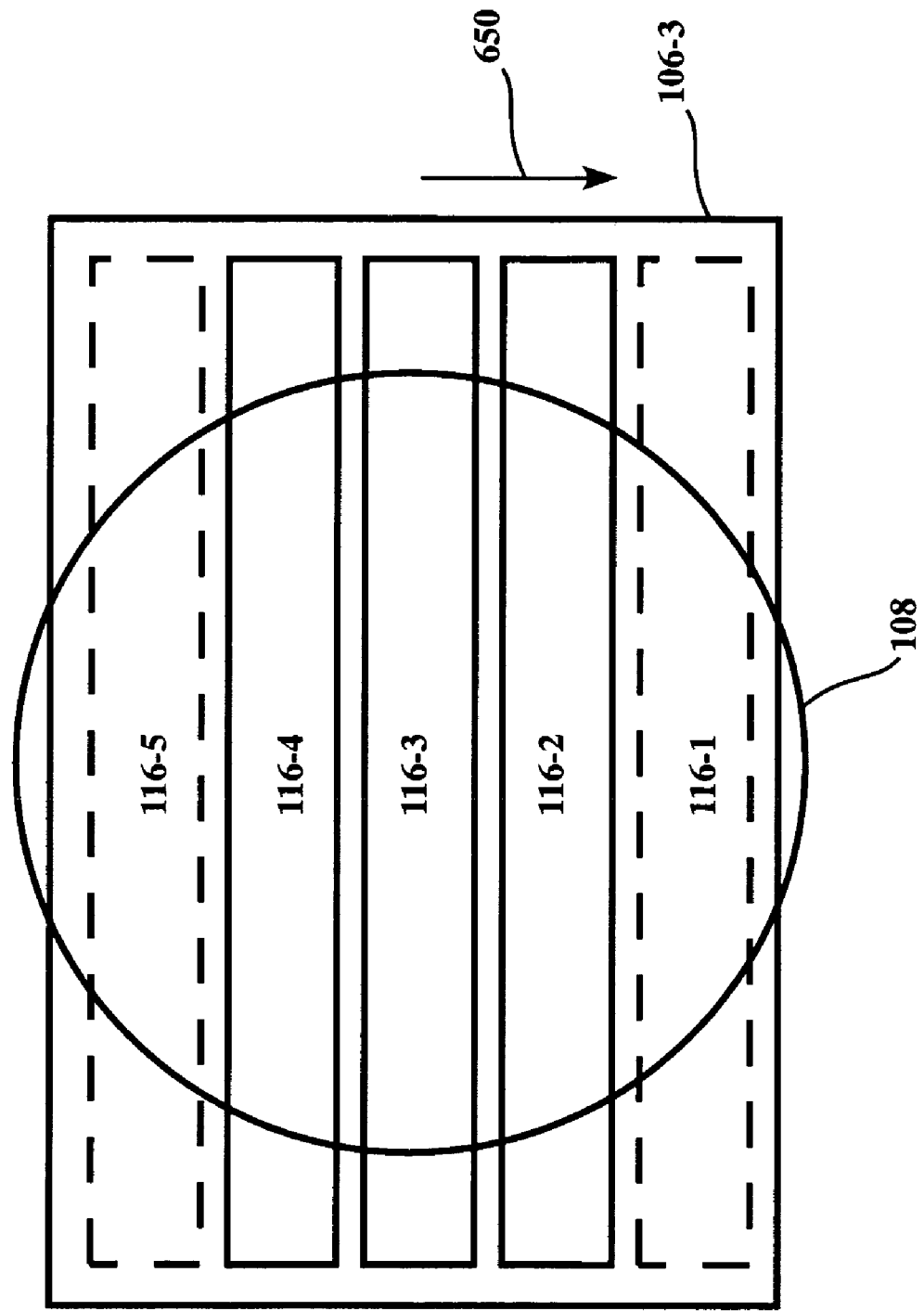
FIG. 9B illustrates the exemplary ALD operation where the proximity head is over the substrate in accordance with one embodiment of the present invention.

FIG. 9B illustrates the exemplary ALD operation where the proximity head 106-3 is over the substrate in accordance with one embodiment of the present invention. In such an embodiment, the proximity head 106-3 is being moved in a direction 650. Therefore, in one embodiment, the fluid meniscus 116-1 scans over the wafer 102 first then fluid menisci 116-2, 116-3, 116-4, and 116-5 in that order. Therefore, in such an example, the fluid menisci 116-1 (if utilized) may rinse the substrate surface in preparation for the ALD process. Then fluid meniscus 116-2 can apply a chemical precursor that can react with a latter applied chemical to generate a layer of substance such as, for example, Titanium Nitride or Tantalum Nitride, on the surface of the substrate. In one embodiment, exemplary chemical precursors may be Titanium Fluoride, Titanium Bromide, Titanium Tetrachloride or Tantalum Fluoride. It should be appreciated that any suitable material may be generated on the substrate surface depending on the chemical precursor and reactant utilized. Then, the fluid meniscus 116-3 can rinse most of the chemical precursor away from the surface of the wafer 102 to leave an atomic layer of the chemical precursor on the substrate surface. After the fluid meniscus 116-3 has left an atomic layer of the chemical precursor on the substrate surface, the fluid meniscus 116-4 may apply a second chemical to the atomic layer of the chemical precursor. The second chemical can be any suitable chemical that can react with the atomic layer of the chemical precursor to generate a layer of the desired substance. In one embodiment, the second chemical may be, for example, Hydrazine, Hydrazones, Hydroxyl Amine, Nitrous Acid, etc. Therefore, by using certain chemical precursors and a second chemical that reacts with the chemical precursor, substances such as, for example, Titanium Nitride, Tantalum Nitride etc., may be laid down on the surface of the wafer 102.

After the fluid meniscus 116-4 has applied the second chemical to the wafer surface, the fluid meniscus 116-5 (if utilized) can rinse and/or clean the wafer surface. The fluid meniscus 116-5, depending on the embodiment, can apply a cleaning fluid or water to the wafer surface.

FIG. 9C shows a proximity head 106-3 after one pass has been made over the wafer 102 in accordance with one embodiment of the present invention. It should be appreciated that the proximity head 106-3 may make any suitable number of passes over the wafer 102 to deposit any suitable number of atomic layers of the desired substance (or different substances). Therefore, when an additional layer of material is desired to be deposited through ALD, the proximity head 106-3 may be applied over the wafer surface again.

Figure 10A:
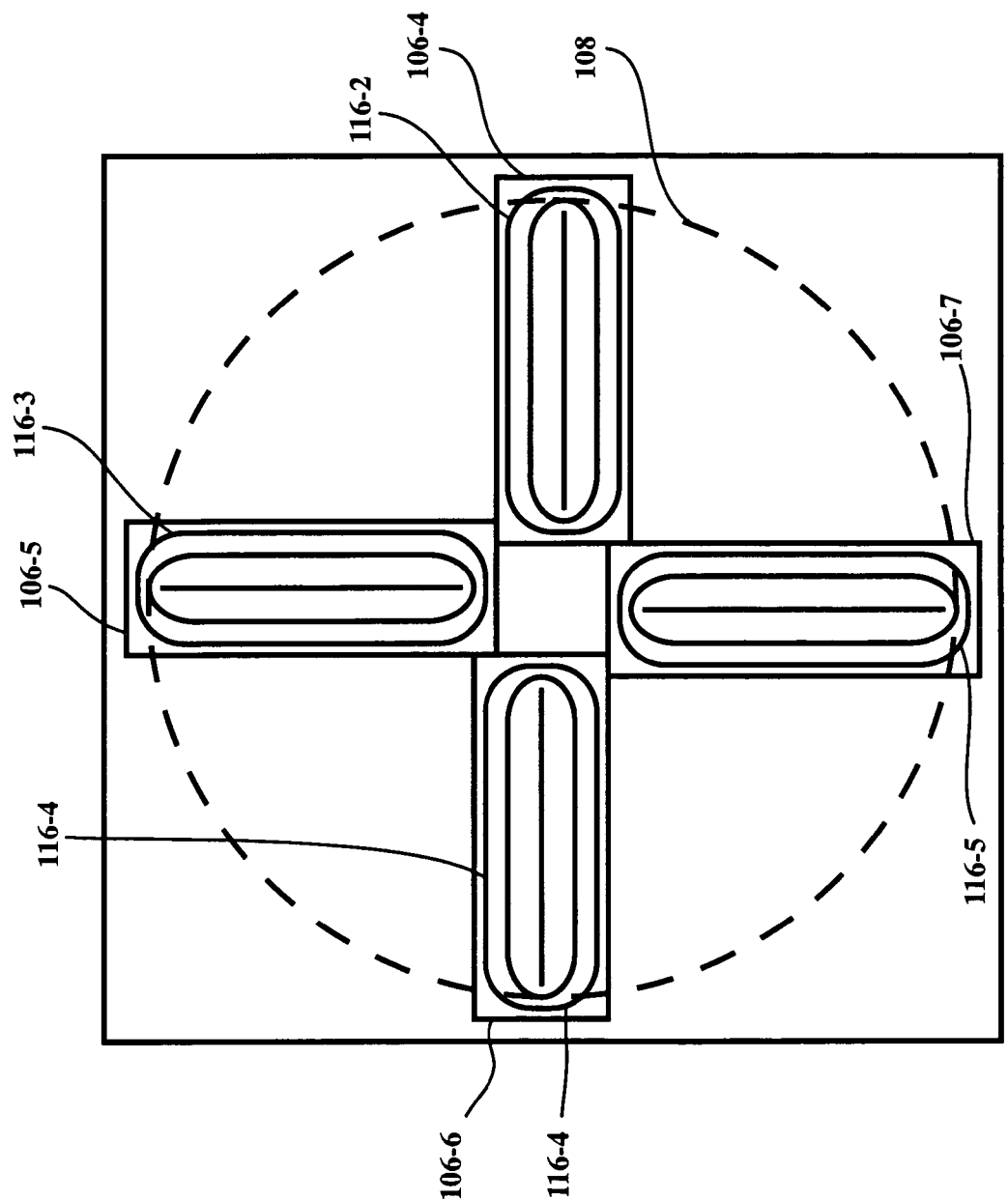
FIG. 10A shows a circular arrangement of proximity heads in accordance with one embodiment of the present invention.
Figure 10B:
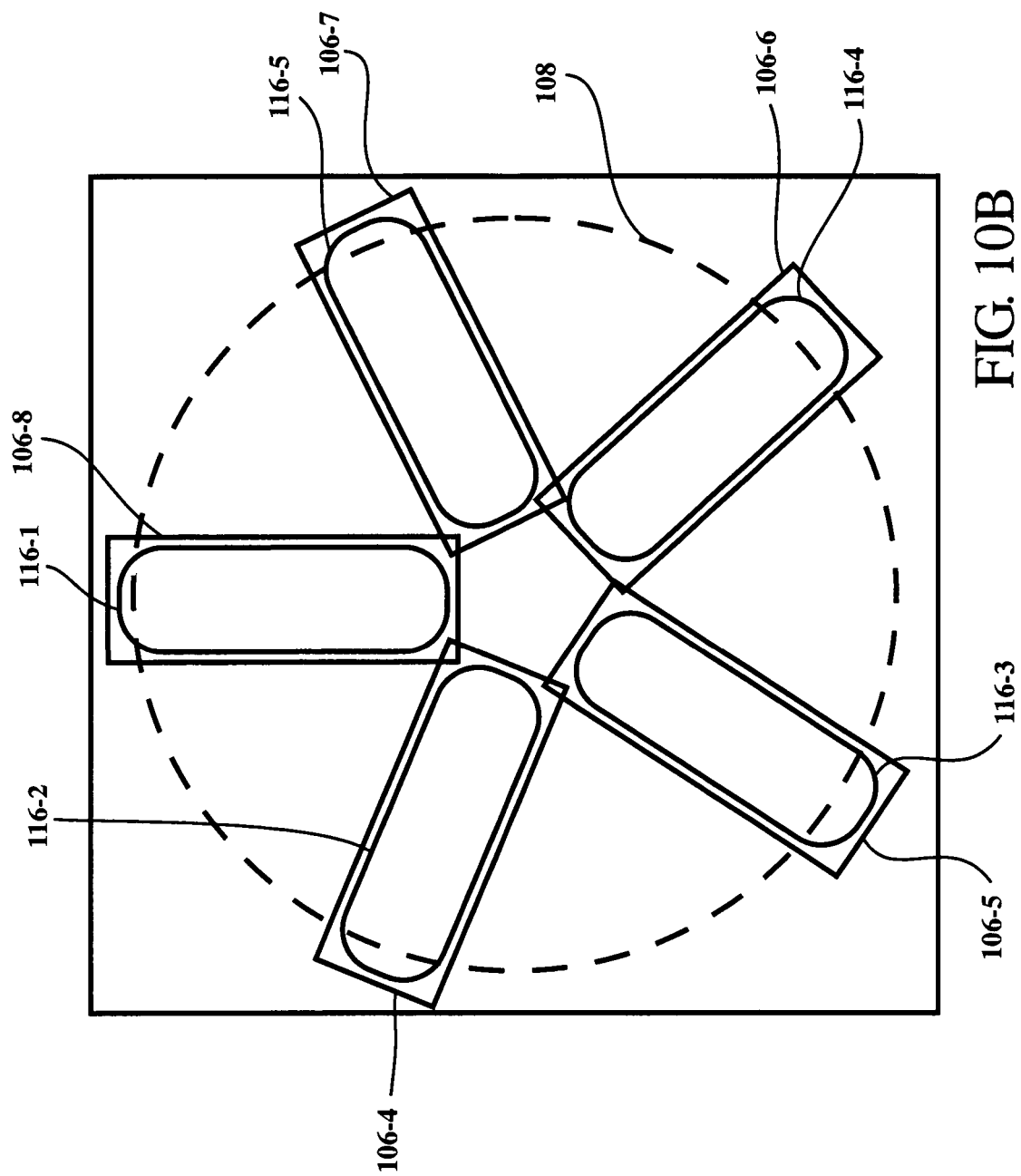
FIG. 10B illustrates another arrangement of proximity heads in accordance with one embodiment of the present invention.

FIGS. 10A through 10C illustrate proximity heads each with a process window where the proximity heads are arranged in a circular orientation. In such a configuration, each of the proximity heads extend from a middle of an imaginary circle to a circumference of a circle. In one embodiment, the proximity heads can move over the wafer surface and rotate the fluid menisci over the wafer surface. In this fashion, when the proximity heads are rotated, the wafer may be processed in the order the fluid menisci are applied to the surface. It should also be appreciated that a single proximity head which may generate multiple fluid menisci may be utilized to approximate the orientation of the fluid menisci generated the multiple proximity heads.

FIG. 10A shows a circular arrangement of proximity heads in accordance with one embodiment of the present invention. In one embodiment, the proximity heads are arranged so there are 4 proximity heads 106-4, 106-5, 106-6, and 106-7 extending from a middle of an imaginary circle to an edge of the imaginary circle. In such an embodiment, instead of scanning the proximity heads 106-4, 106-5, 106-6, and 106-7 over the wafer 108 in a line, the proximity heads 106-4, 106-5, 106-6, and 106-7 can be oriented and configured to apply fluid menisci rotationally around a center axis of the wafer 108. Therefore, in one embodiment, the fluid meniscus 116-2 can process a particular region while the wafer 108 and/or the proximity heads 106-4, 106-5, 106-6, and 106-7 are rotated. As the rotation continues, the fluid meniscus 116-3 can follow fluid meniscus 116-2 and so on by a clockwise rotation of the proximity heads 106-4, 106-5, 106-6, and 106-7 or a counterclockwise rotation of the wafer. Therefore, a particular surface of the wafer 102 can be processed by the fluid menisci 116-2, 116-3, 116-4, and 116-5 in that order. In one embodiment, the fluid meniscus 116-2 can apply a chemical precursor to the wafer surface. Then the fluid meniscus 116-3 can rinse the surface of the wafer which has the chemical precursor to leave an atomic layer of the chemical precursor on the wafer surface. The fluid meniscus 116-4 can apply a chemical reactant which reacts with the chemical precursor to leave an atomic layer of a desired substance on the wafer surface. Then the fluid meniscus 116-5 can rinse the wafer surface. Therefore, such an apparatus can also be utilized to deposit an atomic layer of a desired substance on the surface of the wafer 108.

FIG. 10B illustrates another arrangement of proximity heads in accordance with one embodiment of the present invention. In such an embodiment, the proximity heads orientation includes proximity heads 106-4, 106-5, and 106-6 that can generate fluid menisci 116-2, 116-3, and 116-4 respectively which can, in one embodiment, be rotated along the surface of the wafer to accomplish ALD. As discussed above in reference to FIG. 10A, the fluid menisci 116-2, 116-3, and 116-4 may be rotated about an axis so the entire wafer surface may be processed through rotation of the proximity heads 106-4, 106-5, and 106-6. In one embodiment, the fluid meniscus 116-2 can apply a chemical precursor to the wafer surface. Then the fluid meniscus 116-3 can rinse the surface of the wafer which has the chemical precursor to leave an atomic layer of the chemical precursor on the wafer surface. The fluid meniscus 116-4 can apply a chemical reactant which reacts with the chemical precursor to leave an atomic layer of a desired substance on the wafer surface.

FIG. 10C illustrates a five proximity heads orientation in accordance with one embodiment of the present invention. In such an embodiment, fluid menisci 116-1, 116-2, 116-3, 116-4, and 116-5 may be generated by proximity heads 106-4, 106-5, 106-6, 106-7, and 106-8 respectively on the wafer surface. As discussed above, the proximity head and/or the wafer may be rotated in an appropriate fashion to the desired order of application of the fluid menisci 116-1, 116-2, 116-3, 116-4, and 116-5 may be generated. In one embodiment, the proximity heads 106-4, 106-5, 106-6, 106-7, and 106-8 may be rotated in a clockwise fashion and/or the wafer may be rotated in a counterclockwise fashion or vice versa. Therefore, fluid menisci can be generated which extend from a center region of the wafer to a circumferential region of the wafer. When such fluid menisci are rotated around the wafer surface, a particular region of the wafer surface will be exposed to certain fluid menisci depending on the direction of rotation of the proximity head and/or the wafer. Therefore, by varying the fluid applied by each of the fluid menisci any suitable types or orders of wafer processing may be accomplished. As discussed above, in one embodiment, the fluid menisci 116-1, 116-2, 116-3, 116-4, and 116-5 may be utilized to conduct ALD.

In one embodiment, the fluid meniscus 116-1 can rinse the wafer surface to prepare the wafer surface for ALD. Then the fluid meniscus 116-2 can apply a chemical precursor to the wafer surface. The fluid meniscus 116-3 can rinse the surface of the wafer which has the chemical precursor to leave an atomic layer of the chemical precursor on the wafer surface. The fluid meniscus 116-4 can apply a chemical reactant which reacts with the chemical precursor to leave an atomic layer of a desired substance on the wafer surface. Then the fluid meniscus 116-5 can rinse the wafer surface.

In the embodiments as described by FIGS. 10A, 10B, and 10C, the proximity heads may be rotated and also moved laterally to cover the center portion of the wafer 108 so the center portion of the wafer 108 may be processed.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for processing a substrate, comprising:
 a first process window configured to apply a first fluid meniscus between the first process window and a surface of the substrate;
 a second process window configured to generate a second fluid meniscus between the second process window and the surface of the substrate; and a third process window configured to generate a third fluid meniscus between the third process window and the surface of the substrate;

wherein the apparatus is configured to apply the first fluid meniscus, the second fluid meniscus, and the third fluid meniscus to the surface of the substrate in order during an atomic layer deposition operation, wherein each of the first, second and third process windows are coupled to a manifold.

2. An apparatus for processing a substrate as recited in claim 1, where the first process window includes a first set of conduits configured to generate the first fluid meniscus.

3. An apparatus for processing a substrate as recited in claim 2, where the first set of conduits includes at least one inlet configured to apply the first fluid to the surface of the substrate and at least one outlet configured to remove the first fluid from the surface of the substrate.

4. An apparatus for processing a substrate as recited in claim 3, where the first set of conduits further includes at least one additional inlet configured to apply surface tension reducing fluid to the surface of the substrate.

5. An apparatus for processing a substrate as recited in claim 2, where the second process window includes a second set of conduits configured to generate the second fluid meniscus.

6. An apparatus for processing a substrate as recited in claim 5, where the second set of conduits includes at least one inlet configured to apply a second fluid to the surface of the substrate and at least one outlet configured to remove the second fluid from the surface of the substrate.

7. An apparatus for processing a substrate as recited in claim 6, where the second set of conduits further includes the at least one additional inlet configured to apply the surface tension reducing fluid to the surface of the substrate.

8. An apparatus for processing a substrate as recited in claim 2, where the third process window includes a third set of conduits configured to generate the third fluid meniscus.

9. An apparatus for processing a substrate as recited in claim 8, where the third set of conduits includes at least one inlet configured to apply a third fluid to the surface of the substrate and at least one outlet configured to remove the third fluid from the surface of the substrate.

10. An apparatus for processing a substrate as recited in claim 7, where the second set of conduits further includes the at least one additional inlet configured to apply the surface tension reducing fluid to the surface of the substrate.

11. An apparatus for processing a substrate as recited in claim 1, wherein the first fluid meniscus is configured to apply a chemical precursor used in atomic layer deposition to the surface of the substrate.

12. An apparatus for processing a substrate as recited in claim 1, wherein the second fluid meniscus is configured to apply one of deionized water, carbon tetrachloride, anhydrous iso-propanol, anhydrous propanol, or anhydrous ethanol to the surface of the substrate.

13. An apparatus for processing a substrate as recited in claim 11, where the third fluid meniscus is configured to apply a chemical configured to react with the chemical precursor to generate an atomic layer of a reactant on the surface of the substrate.

14. An apparatus for processing a substrate, comprising:

a first set of conduits defined on a surface of the apparatus configured to apply a first fluid meniscus between the first set of conduits and a surface of the substrate;

a second set of conduits defined on the surface of the apparatus configured to generate a second fluid meniscus between the second set of conduits and the surface of the substrate; and a third set of conduits configured to generate a third fluid meniscus between the third set of conduits and the surface of the substrate;

wherein the apparatus is configured to apply the first fluid meniscus, the second fluid meniscus, and the third fluid meniscus to the surface of the substrate in order during an atomic layer deposition operation, and the first, second and third conduits are each coupled to a manifold.

15. An apparatus for processing a substrate as recited in claim 14, where the first set of conduits includes at least one inlet configured to apply the first fluid to the surface of the substrate and at least one outlet configured to remove the first fluid from the surface of the substrate.

16. An apparatus for processing a substrate as recited in claim 15, where the first set of conduits further includes at least one additional inlet configured to apply surface tension reducing fluid to the surface of the substrate.

17. An apparatus for processing a substrate as recited in claim 14, where the second set of conduits includes at least one inlet configured to apply a second fluid to the surface of the substrate and at least one outlet configured to remove the second fluid from the surface of the substrate.

18. An apparatus for processing a substrate as recited in claim 17, where the second set of conduits further includes the at least one additional inlet configured to apply the surface tension reducing fluid to the surface of the substrate.

19. An apparatus for processing a substrate as recited in claim 14, where the third set of conduits includes at least one inlet configured to apply a third fluid to the surface of the substrate and at least one outlet configured to remove the third fluid from the surface of the substrate.

20. An apparatus for processing a substrate as recited in claim 19, where the second set of conduits further includes the at least one additional inlet configured to apply the surface tension reducing fluid to the surface of the substrate.

21. An apparatus for processing a substrate as recited in claim 14, wherein the first fluid meniscus is configured to apply a chemical precursor used in atomic layer deposition to the surface of the substrate.

22. An apparatus for processing a substrate as recited in claim 14, wherein the second fluid meniscus is configured to apply one of deionized water, carbon tetrachloride, anhydrous iso-propanol, anhydrous propanol, or anhydrous ethanol to the surface of the substrate.

23. An apparatus for processing a substrate as recited in claim 21, where the third fluid meniscus is configured to apply a chemical configured to react with the chemical precursor to generate an atomic layer of a reactant on the surface of the substrate.

* * * * *